US005987637A

United States Patent [19]
Thomas

[11] Patent Number: 5,987,637
[45] Date of Patent: Nov. 16, 1999

[54] TRACEBACK STAGE FOR A VITERBI DECODER

[75] Inventor: Richard James Thomas, Clifton, United Kingdom

[73] Assignee: Discovision Associates, Irvine, Calif.

[21] Appl. No.: 08/802,189

[22] Filed: Feb. 18, 1997

[30]     Foreign Application Priority Data

Oct. 30, 1996 [GB] United Kingdom .................. 9622540

[51] Int. Cl.$^6$ .................................................. G06F 11/10
[52] U.S. Cl. .......................................................... 714/795
[58] Field of Search ............................... 371/43.7, 43.2, 371/43.8; 714/795

[56]           References Cited

U.S. PATENT DOCUMENTS

| | | | |
|---|---|---|---|
| 4,709,377 | 11/1987 | Martinez et al. ....................... | 375/265 |
| 4,713,829 | 12/1987 | Eyuboglu ............................... | 375/259 |
| 4,748,626 | 5/1988 | Wong ........................................ | 371/30 |
| 5,162,797 | 11/1992 | Murata et al. ........................... | 341/107 |
| 5,187,675 | 2/1993 | Dent et al. .......................... | 364/715.06 |
| 5,233,630 | 8/1993 | Wolf ....................................... | 375/308 |
| 5,408,502 | 4/1995 | How ........................................ | 375/340 |
| 5,416,787 | 5/1995 | Kodama et al. ........................ | 371/43.2 |
| 5,465,275 | 11/1995 | Blaker et al. ........................... | 375/341 |
| 5,497,401 | 3/1996 | Ramaswamy et al. .................. | 375/341 |
| 5,506,636 | 4/1996 | Patel et al. .............................. | 348/725 |
| 5,712,880 | 1/1998 | Rim et al. ............................... | 375/341 |

FOREIGN PATENT DOCUMENTS

| | | |
|---|---|---|
| 0676875A1 | 10/1995 | European Pat. Off. . |
| 0682415A1 | 11/1995 | European Pat. Off. . |
| 9428656 | 12/1994 | WIPO . |

OTHER PUBLICATIONS

Cypher, Robert. Generalized Trace–Back Techniques for Survivor Memory Management in the Viterbi Algorithm. Journal of VLSI Signal Processing, Jan. 1993 pp. 85–94.

Paaske, E. S. Pedersen and J Sparse. An Area–Efficient Path Memory Structure for VLSI Implmentation of High Speed Viterbi Decoders. Integration, the VLSI Journal, Nov. 1991 pp. 79–91.

European Telecommunciations Standards Institute "European Telecommunication Standard: Digital Broadcasting Systems for Television, Sound and Data Services; Framing Structure, Channel Coding and Modulation for Digital Television." Valbonne, France. May 1996, pp. 1–40.

Fettweis, Gerhard and Heinrich Meyr, "Parallel Viterbi Algorithm Implementation: Breaking the ACS–Bottleneck," IEEE Transaction on Communications, vol. 37, No. 8, Aug. 1989.

J. Sparso et al., "An Area–Efficient Topology for VLSI Implementation of Viterbi Decoders and Other Shuffle–Exchange Type Structures," IEEE Journal of Solid–State Circuits, vol. 26, No.2 Feb. 1991.

Le Goff, Stephane. Alain Glavieux and Cluade Berrou. "Turbo–Codes and High Spectral Efficiency Modulation." Telecom Bretagne, France Telecom University, IEEE 0–7802–1825–0/94, 1994. pp. 645–649.

Troung, T.K. et al., "A VLSI Design for a Trace–Back Viterbi Decoder," IEEE Transactions on Communications, vol. 40, No. 3, Mar. 1992.

*Primary Examiner*—William Grant
*Assistant Examiner*—Chad Rapp
*Attorney, Agent, or Firm*—Donald Bollella

[57]           ABSTRACT

In a traceback unit for an M-step Viterbi decoder for a convolutionally encoded data stream, each of the traceback stages has a group of K input wires representing K possible candidate states. A bank of K multiplexers selects one of $2^M$ of the input wires according to M bits of traceback data. The K multiplexer outputs feed a succeeding traceback stage. M groups of K wires carry the traceback data, with each wire being connected to a selection line of each multiplexer. At the output of the traceback unit an identification circuit identifies a subgroup of the K possibilities which has a maximum number of candidate states remaining therein. The arrangement obviates the need for retiming between every traceback stage.

4 Claims, 27 Drawing Sheets

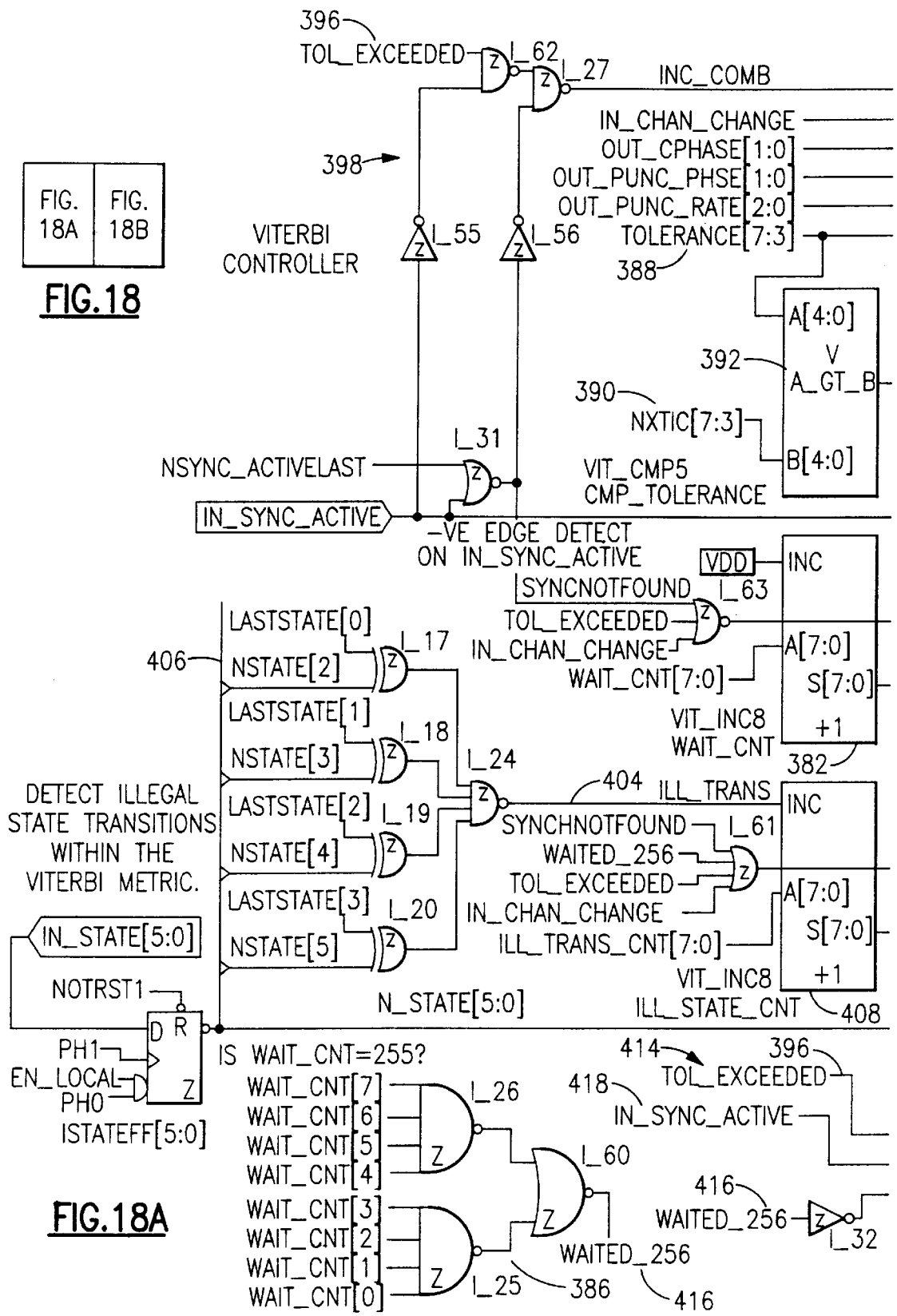

TRACEBACK STAGE FOR A VITERBI DECODER

BACKGROUND OF THE INVENTION

1. Field of the Invention

This invention relates to a decoder of a convolutional coded data stream. More particularly this invention relates to an improved traceback facility for a Viterbi decoder.

2. Description of the Related Art

Viterbi decoders are important in modern telecommunications, in which digital signals are convolutionally encoded. In a modern application, coded orthogonal frequency division multiplexing ("COFDM") requiring a convolutional code has been proposed in the European Telecommunications Standard DRAFT pr ETS 300 744 (May 1996), which specifies the framing structure, channel coding, and modulation for digital terrestrial television. This standard was designed to accommodate digital terrestrial television within the existing spectrum allocation for analog transmissions, yet provide adequate protection against high levels of co-channel interference and adjacent channel interference. A flexible guard interval is specified, so that the system can support diverse network configurations, while maintaining high spectral efficiency, and sufficient protection against co-channel interference and adjacent channel interference from existing Phase Alternating Line System ("PAL")/Sequential Coleur A'Memorie ("SECAM") services. Two modes of operation are defined: a "2K mode", suitable for single transmitter operation and for small single frequency networks with limited transmitter distances, and an "8K mode". The latter can be used for either single transmitter operation or for large single frequency networks. Various levels of quadrature amplitude modulation ("QAM") are supported, as are different inner code rates, in order to balance bit rate against ruggedness. The system is intended to accommodate a transport layer according to the Moving Picture Experts Group ("MPEG"), and is directly compatible with MPEG-2 coded TV signals (International Organization for Standardization/International Electrotechnical Commission ("ISO/IEC") Specification 13818).

In the noted European Telecommunications Standard data carriers a COFDM frame can be either quadrature phase shift keyed ("QPSK"), 16-QAM, 64-QAM, non-uniform 16-QAM, or non-uniform 64-QAM using Gray mapping.

In the following discussion reference may be to FIG. 1, which illustrates a simplified transition trellis diagram 167 according to a one-step Viterbi decoding process at a coding rate of ½, according to convolutional encoding with a constraint length K=3, and a generator polynomial $$G(x)=(x^2+x+1, x^2+1). \quad (1)$$

The rate ½ indicates that for every one bit input, the encoder generates two bits. The constraint length K is the maximum number of signals that can be used to generate an output. Using a transition trellis diagram such as diagram 167, and an incoming data sequence, it is possible to generate an output stream following a sequence of states S. In the diagram 167 a particular state $S_t$ can be represented by two bits. For example, state $S_t$ can assume the value 2 (binary 10), indicated by reference numeral 169. In the representation of diagram 167, in state $S_{t+1}$ the bits of state $S_t$ are shifted by one position, and an incoming data bit occupies the rightmost (least significant bit) position. Thus, the state value 169 can legally transition to values 171 and 173 in state $S_{t+1}$. For these two transitions, the convolutional encoder will produce values 175 and 177 respectively, indicated more generally as $x_t y_t$. All possible state transitions can be calculated for the encoder, i.e. given $S_t$ and data bit $d_t$, the next state $S_{t+1}$, $x_t$ and $y_t$ can be evaluated.

The path metric is a measurement of the likelihood that the state is on the original encoder state sequence at that time. The smaller the path metric, the more probable the state is, and vice versa. The branch metric is a measurement of the probability value attached to each branch depending on the input. The branch metric is taken as the Hamming weight, which is the number of differing bits between a received symbol $xy_{rx}$ and an expected symbol xy along every branch in each transition as shown in FIG. 1. Traceback is the method of going back through the trellis to find the initial state which produced the state with the smallest path metric.

In the preferred embodiment a 2-step decoding process is employed, corresponding to moving through the trellis two steps at a time. This doubles the time to calculate each step, and each traceback yields two bits, rather than one. However the number of calculations required at each state has also doubled, as each state now has four possible paths to be calculated. Only one path is required to be maintained in memory for each state. That path, known as the surviving path, is the one having the smallest path metric and is thus the most likely path.

Puncturing has the effect of producing a higher rate of data transmission, as the code is more efficient. In exemplary Table 2, the convolutional encoder (not shown) encodes data to produce symbols $x_t$ and $y_t$, which are then punctuated according to the puncturing matrix x: 1 0
y: 1 1 to produce $x'_t$ and $y'_t$, which are then retimed to be transmitted as I,Q in quadrature phase shift keyed modulation. When decoding with punctured data, the omitted bits do not contribute to the branch metric calculation.

TABLE 1

| data | $d_0$ | $d_1$ | $d_2$ | $d_3$ | $d_4$ |
|---|---|---|---|---|---|
| xy | $x_0y_0$ | $x_1y_1$ | $x_2y_2$ | $x_3y_3$ | $x_4y_4$ |
| x'y' | $x_0y_0$ | $y_1$ | $x_2y_2$ | $y_3$ | $x_4y_4$ |
| IQ | $x_0y_0$ | $y_1x_2$ | $y_2y_3$ | $x_4y_4$ | |

In the simple example given above, branch metrics were calculated using the Hamming Weight. Significant improvements result if, instead of receiving either a 1 or 0, we receive a multiple bit representation of each $x_{rx}$ and $y_{rx}$ showing the relative likelihood of the signal being a 1 or 0. Thus, in a 16 level (4-bit) soft decoding, a 1 is represented by 15 (binary 1111).

In 16 level decoding, if, for example, $xy_{rx}$=(3, 14) are received, the branch metrics may be calculated as shown in Table 2. When calculating new path metrics, the respective path metrics are calculated using these soft-calculated branch metrics, giving significant improvements in decoder performance. In the preferred embodiment, an 8 level (3-bit) soft decoding is used. Traceback is implemented using a systolic array, as explained below in detail.

TABLE 2

| expected xy$_{rx}$ | branch | calculation | result |
|---|---|---|---|
| 00 | 0 | \|0–3\| + \|0–14\| | 17 |
| 01 | 1 | \|0–3\| + \|15–14\| | 4 |
| 10 | 2 | \|15–3\| + \|0–14\| | 26 |
| 11 | 3 | \|15–3\| + \|15–14\| | 13 |

In the preferred embodiment, data is convolutionally encoded using a constraint length K=7, which corresponds to a trellis having 64 states. A partial representation of a 2-step transition trellis diagram for this situation is illustrated in FIG. 2.

In the noted European Telecommunications Standard there is an outer Reed-Solomon code, and an inner punctured convolutional code, based on a mother convolutional code of rate ½ with 64 states, and having generator polynomials $G_1=171_{OCT}$ for X output and $G_2=133_{OCT}$ for Y output. In one mode of operation, other punctured rates of ⅔, ¾, ⅝ and ⅞ are allowed.

During the Viterbi decoding process, traceback requires a substantial amount of processing time and hardware resources. The traceback module in a Viterbi decoder also represents an important production cost.

SUMMARY OF THE INVENTION

It is therefore a primary object of the present invention to provide an improved Viterbi decoder for use in decoding convolutional coded data streams.

It is another object of the invention to provide an improved traceback facility in a Viterbi decoder, which is economical to produce with modern methods of hardware design, and which minimizes hardware resources.

It is yet another object of the invention to provide a traceback facility for a Viterbi decoder which can be conveniently applied to various applications in telecommunications and other technologies.

These and other objects of the present invention are attained by an M-step Viterbi decoder for a convolutionally encoded data stream. The decoder has a path metric calculator for K possible states, and a plurality of traceback stages that in a cycle of operation accept both a minimum path metric state identification and a traceback data from the path metric calculator. In each of the traceback stages a group of K input wires represents the candidate states of a stage of operation, and define a plurality of input subgroups. In a bank of K selectors, which can be multiplexers, each selector has N inputs mapped to an input subgroup, and has selection lines for accepting M bits of traceback data, where $N=2^M$. The bank of K selectors has K outputs connected to a succeeding traceback stage. M groups of K wires carry traceback data, and a predetermined wire of each group of the M groups is operatively mapped to a selection line of each the selectors.

The K outputs define a plurality of output subgroups. The decoder has an identification circuit for determining which of the output subgroups has a maximum number of candidate states remaining therein.

According to an aspect of the invention the identification circuit comprises a plurality of adders each connected to one of the output subgroups for adding the outputs thereof, and a comparator circuit coupled to the adders.

According to another aspect of the invention there is a plurality of retiming registers, wherein the number of traceback stages exceeds the number of retiming registers.

BRIEF DESCRIPTION OF THE DRAWING

For a better understanding of these and other objects of the present invention, reference is made to the detailed description of the invention, by way of example, which is to be read in conjunction with the following drawings, wherein:

FIG. 3, are a block diagram of a Viterbi decoder;

FIG. 13, are an electrical schematic illustrating an add-compare-select unit in the path metric generation block of the Viterbi decoder illustrated in FIG. 3;

FIGS. 18A–18B, collectively referenced FIG. 18, are an electrical schematic of the control block explained in FIG. 17;

DESCRIPTION OF THE PREFERRED EMBODIMENT

Figure 1:
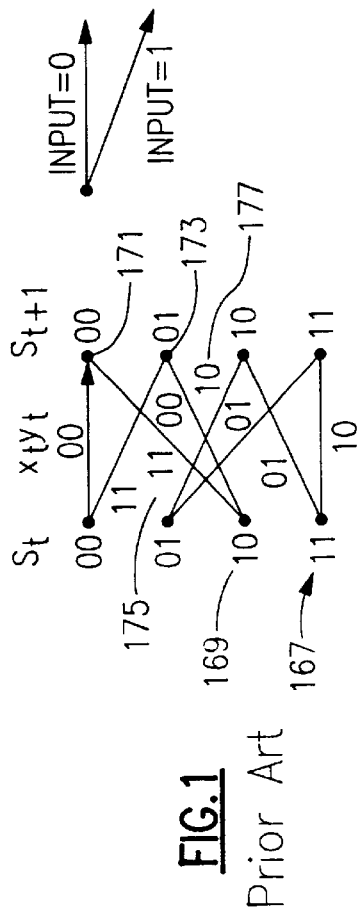
FIG. 1 illustrates a simplified transition trellis diagram according to a one-step Viterbi decoding process.

Referring now to FIG. 3, a Viterbi decoder has a rotation adjustment block 179, which receives in-phase and quadrature data on lines 48, 50. Validity of the incoming data is indicated by the state of a signal on line 52. In preceding stages the demodulator can lock the signal constellation in any of 8 carrier rotation phases, taking into consideration that it is possible for the received signal spectrum to be inverted in the sense that an I,Q symbol is received as a Q,I symbol. However, this condition is dealt with as discussed below, rather than in the rotation adjustment block 179. The present rotation phase is placed on a bus 181.

For all possible branches (256 in the preferred embodiment, using a constraint length K=7, and 2-step decoding), branch metrics are calculated at each operation cycle in branch metric generation block 186, which is controlled by phase and punctuation control block 188. The current puncture rate on bus 185 and current puncture phase on bus 187 are input to the phase and punctuation control block 188 from a higher control block, which is Viterbi control block 195. States in the branch metric generation block 186 are mapped and selected for puncturing and phase adjustment according to the state of lines 197, 199, 201, and 203.

Figures 4, 4A:
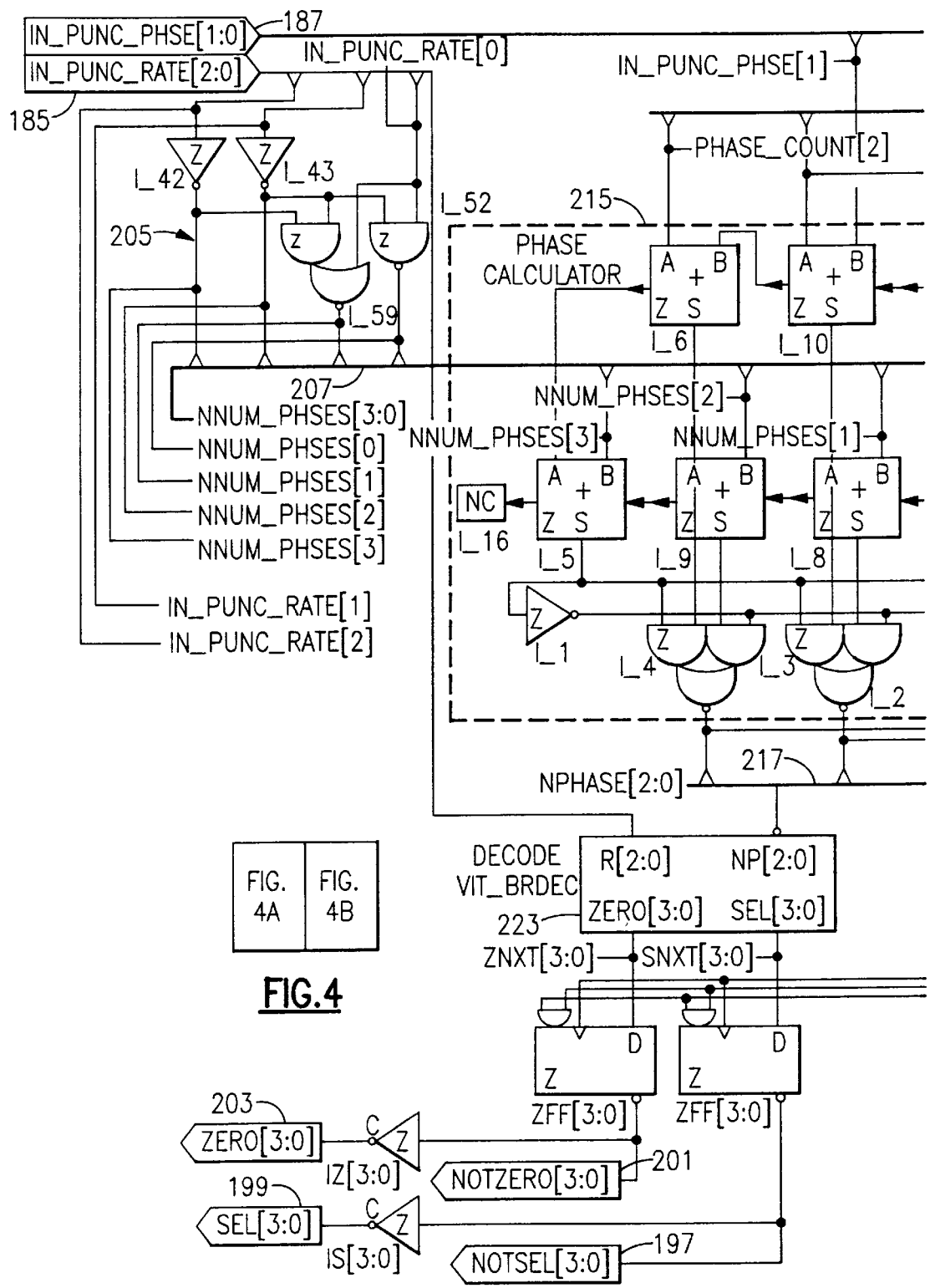
FIGS. 4A–4B, collectively referenced
FIG. 4, are an electrical schematic of a control unit in the Viterbi decoder illustrated in FIG. 3.
Figure 4B:
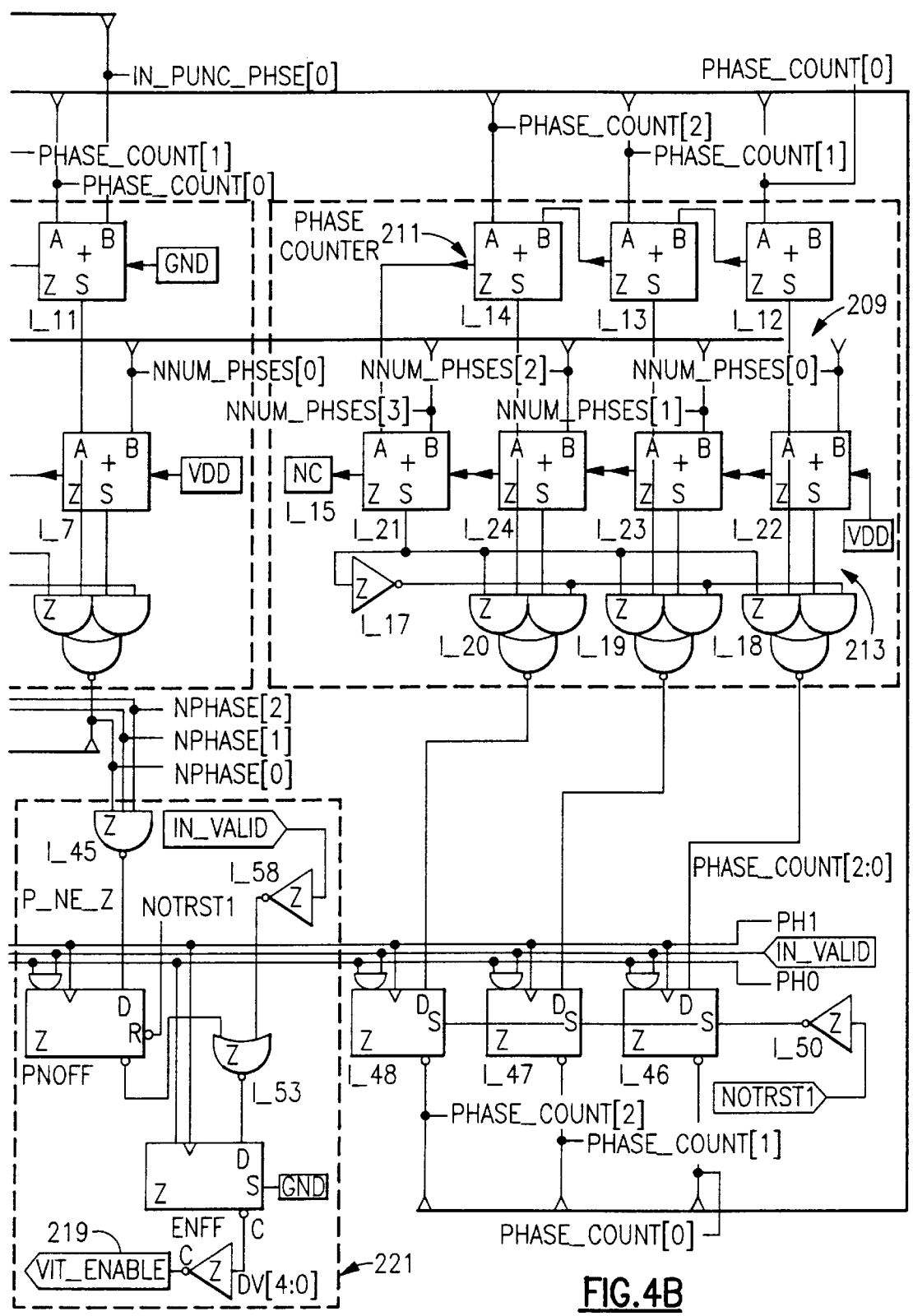

The phase and punctuation control block 188 is shown in greater detail in FIG. 4. The maximum number of phases is derived from the puncture rate on bus 185 by combinatorial logic network 205, and placed on bus 207. Phase counting is accomplished in section 209 by a three bit adder, referenced generally at 211, followed by a 4-bit subtracter, indicated at 213. The phase count, modulo the maximum number of phases, is determined and submitted to phase calculation section 215, where the current puncture phase is added to the phase count in the same manner as in section 209. The current phase, modulo the maximum number of phases, appears on bus 217. As there is a difference between the data transmission rate of the punctuated data stream and the system processing rate, it is necessary to enable and disable the Viterbi decoder according to the punctuation phase. A global enable signal 219 is generated by a small logical network 221.

Figure 5:
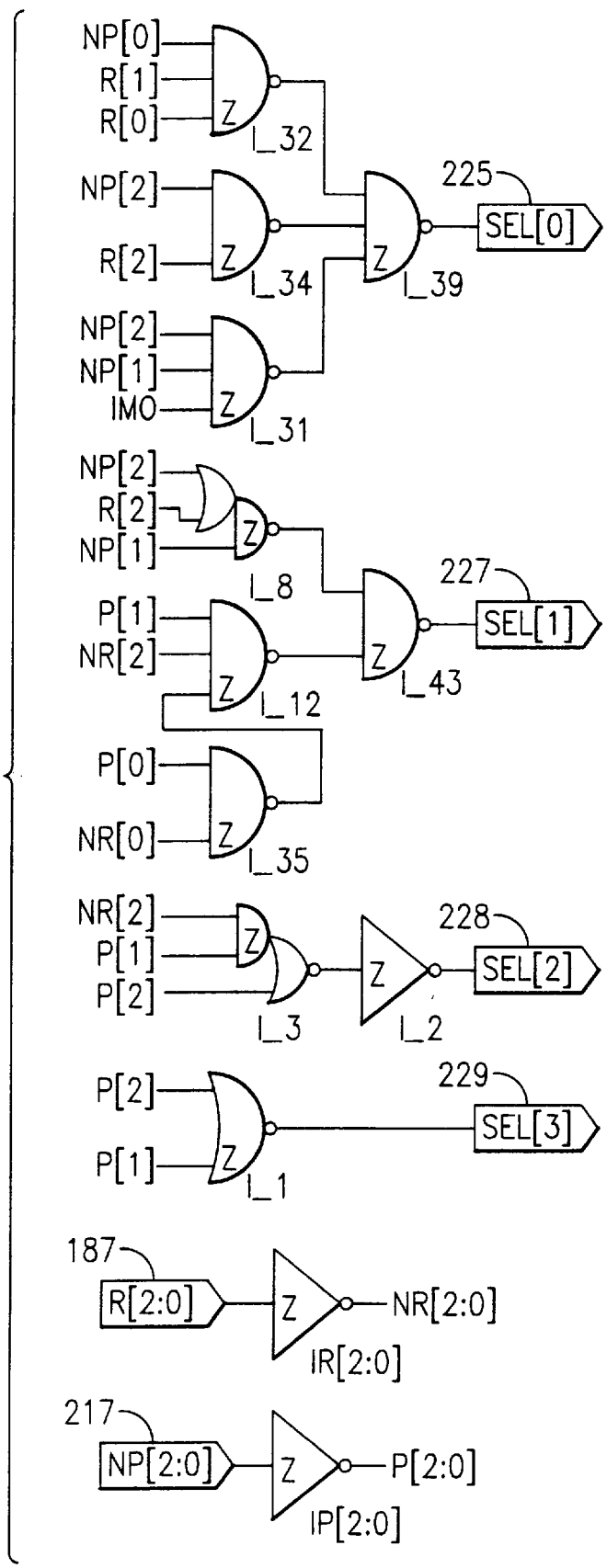
FIGS. 5, 6, and 7 illustrate decode logic in the control unit shown in FIG. 4.
Figure 7:
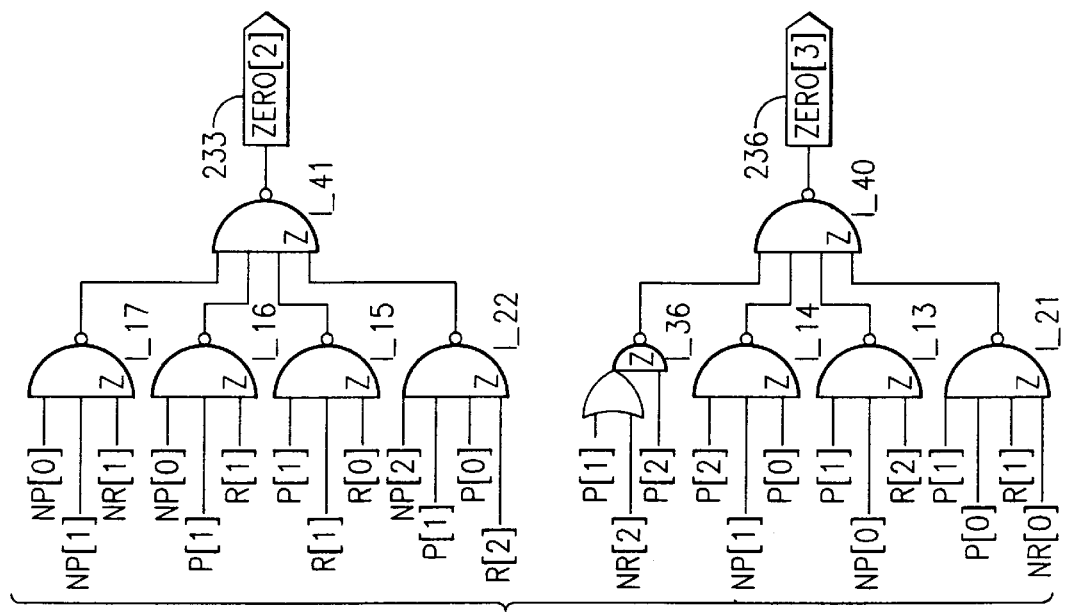
Figure 6:
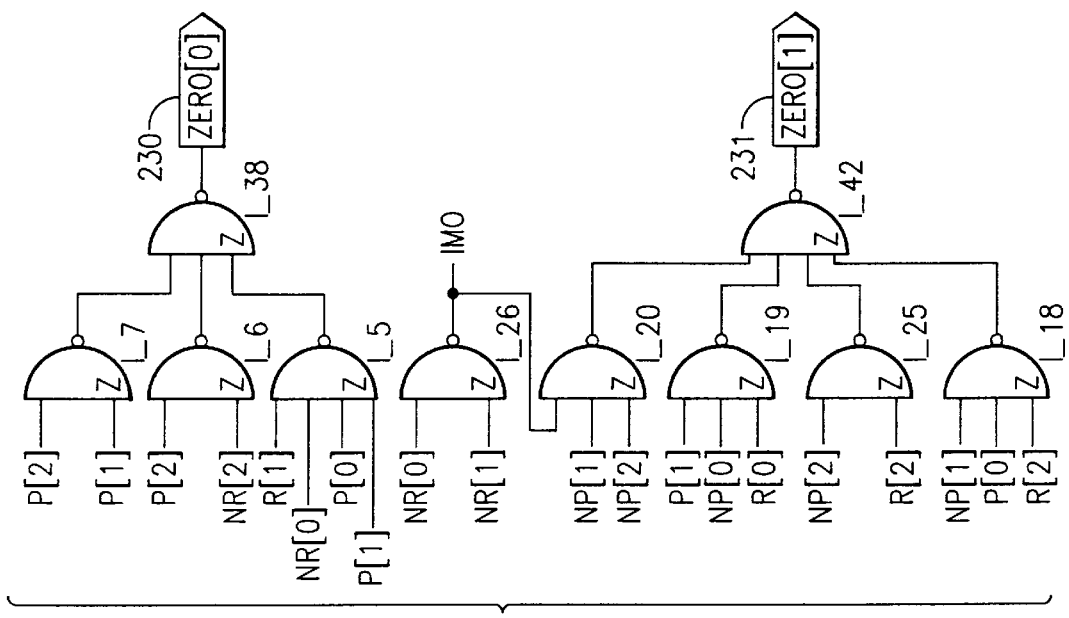

The output of the phase calculation section 215 is also used in a block 223 to decode the phase and rate information on buses 187 and 217 to produce the signals on buses 197, 199, 201, and 203, which are communicated to the branch metric generation block 186 (FIG. 3). The decode logic for buses 197 and 199 is shown in FIGS. 5, 6, and 7, wherein individual bit positions are referenced on lines 225, 227, 228, 229, 231, 233 and 236. The signals on buses 201 and 203 (FIG. 3) are complementary to those on buses 197 and 199 respectively. As will be seen below, bus 199 selects a choice of I,Q inputs during branch generation, and bus 203 indicates where a puncture has occurred so that the data at the puncture location does not contribute to the path metric calculation.

Figure 8:
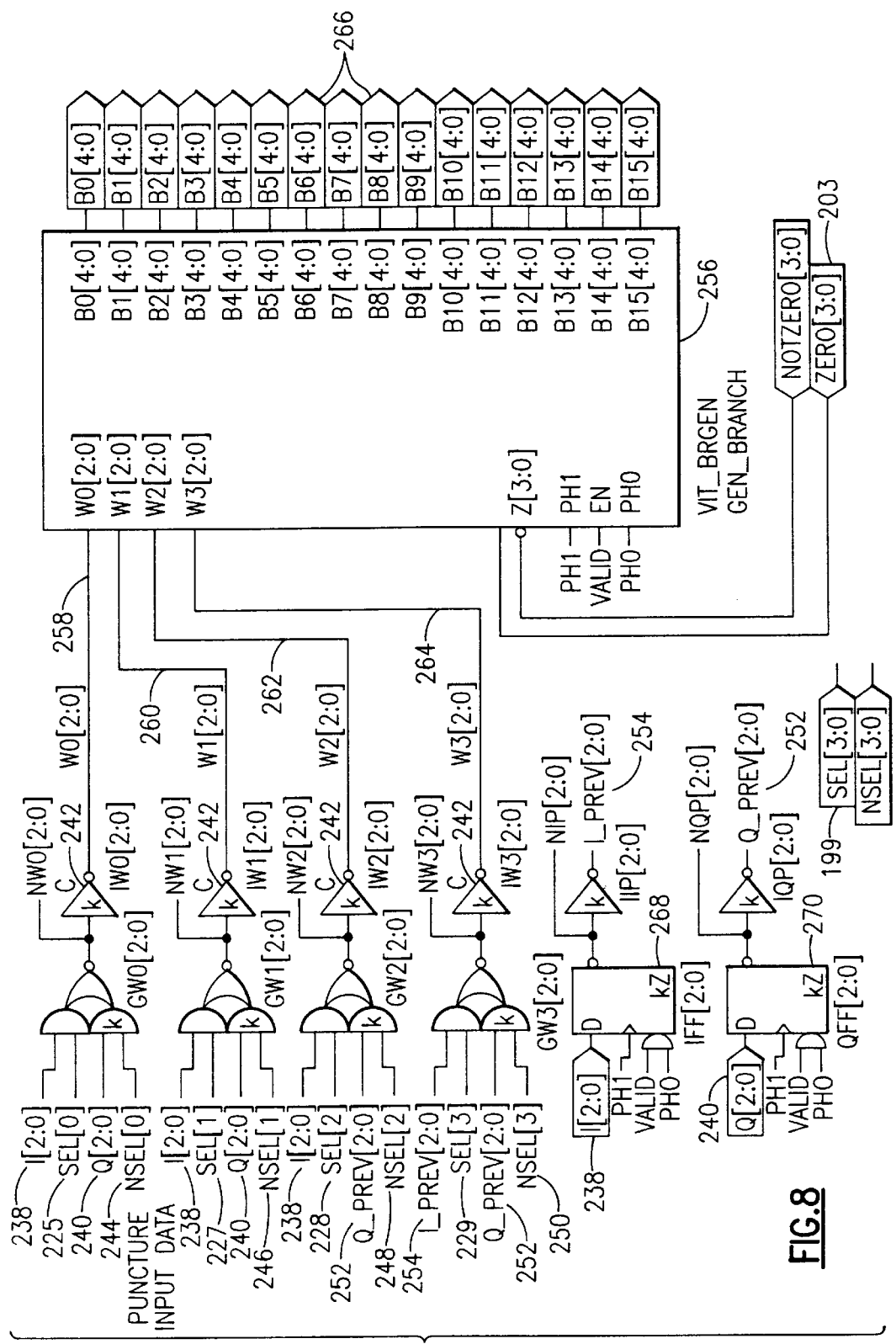
FIG. 8 is an electrical schematic of the branch metric generation block of the Viterbi decoder illustrated in FIG. 3.

The branch metric generation block 186 (FIG. 3) is shown in greater detail in FIG. 8. Pairs of I,Q data are received on lines 238, 240 respectively, and are processed in four combinatorial logic units 242, according to selector lines 225, 227, 228, 229, which are the complement of lines 197 (indicated as lines 244, 246, 248, 250), and the previous I,Q data on lines 252 and 254. From this data, two symbol XY pairs are reconstituted and presented to block 256 on lines 258, 260, 262, 264 for the generation of all 16 possible branch metrics on lines 266. The previous I,Q data is obtained from two delay flip-flops 268, 270.

Figures 9, 9D:
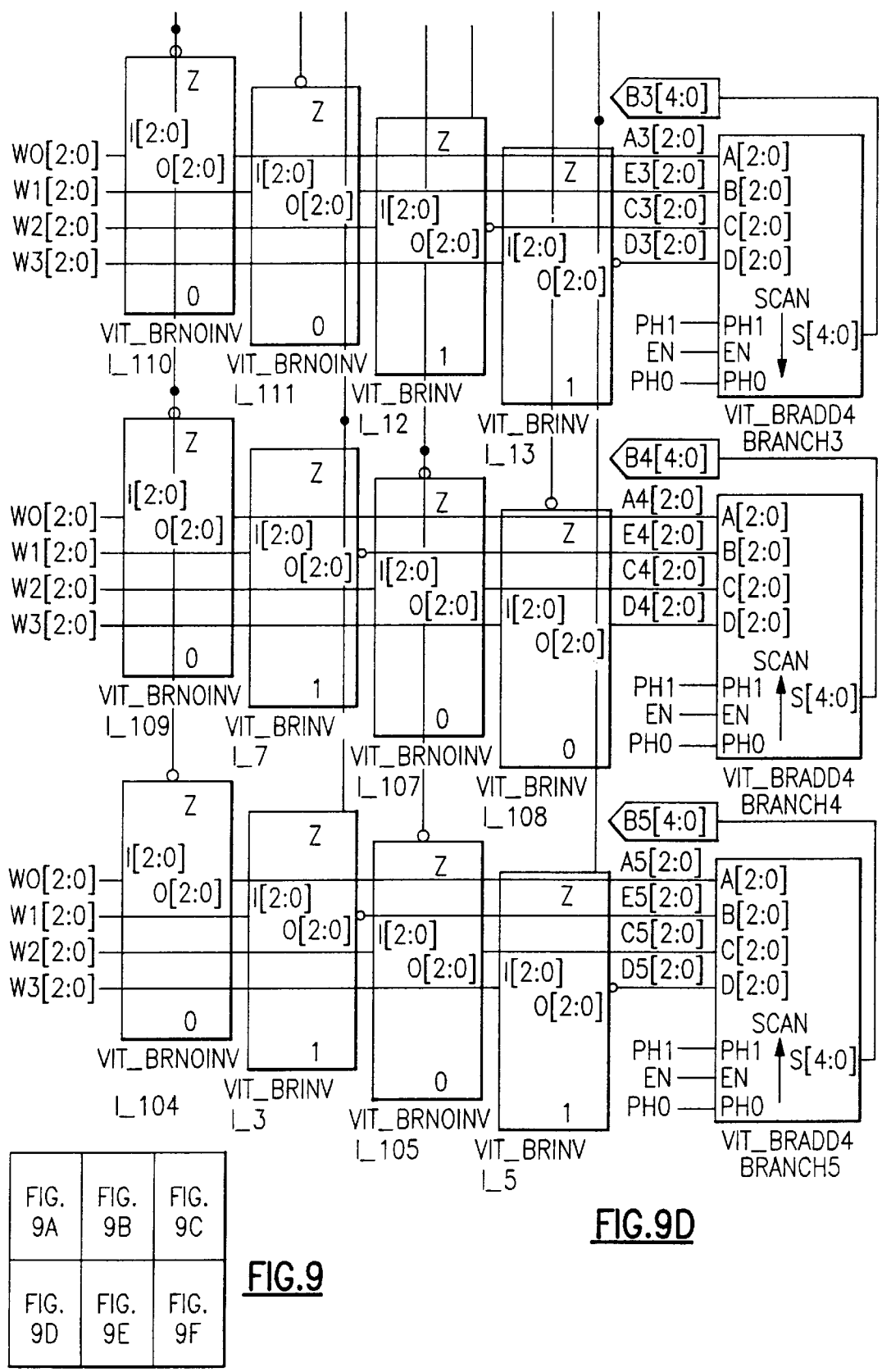
FIGS. 9A–9F, collectively referenced
FIG. 9, are an electrical schematic illustrating in further detail a portion of the circuit of FIG. 8.
Figure 9A:
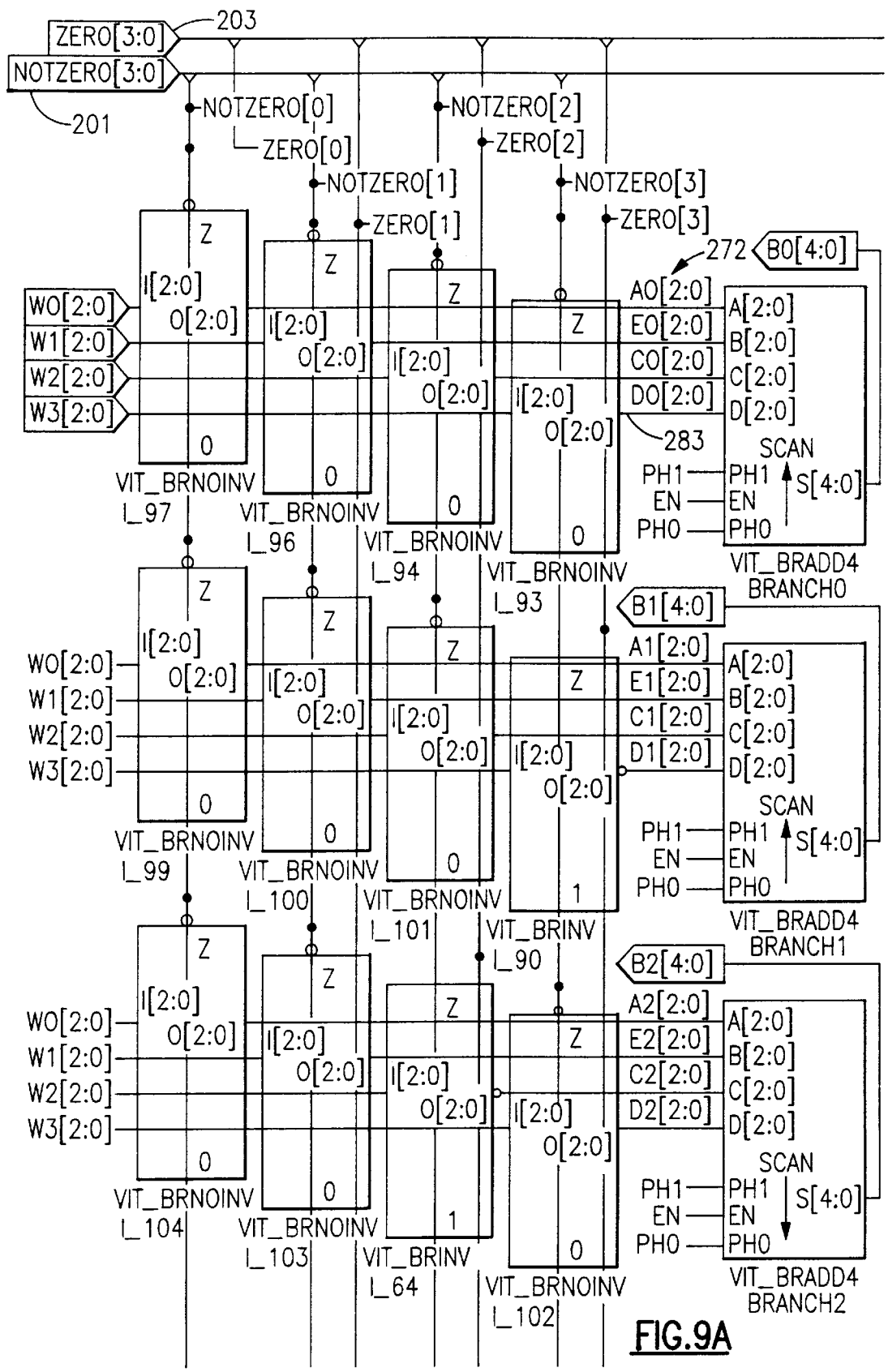
Figure 9B:
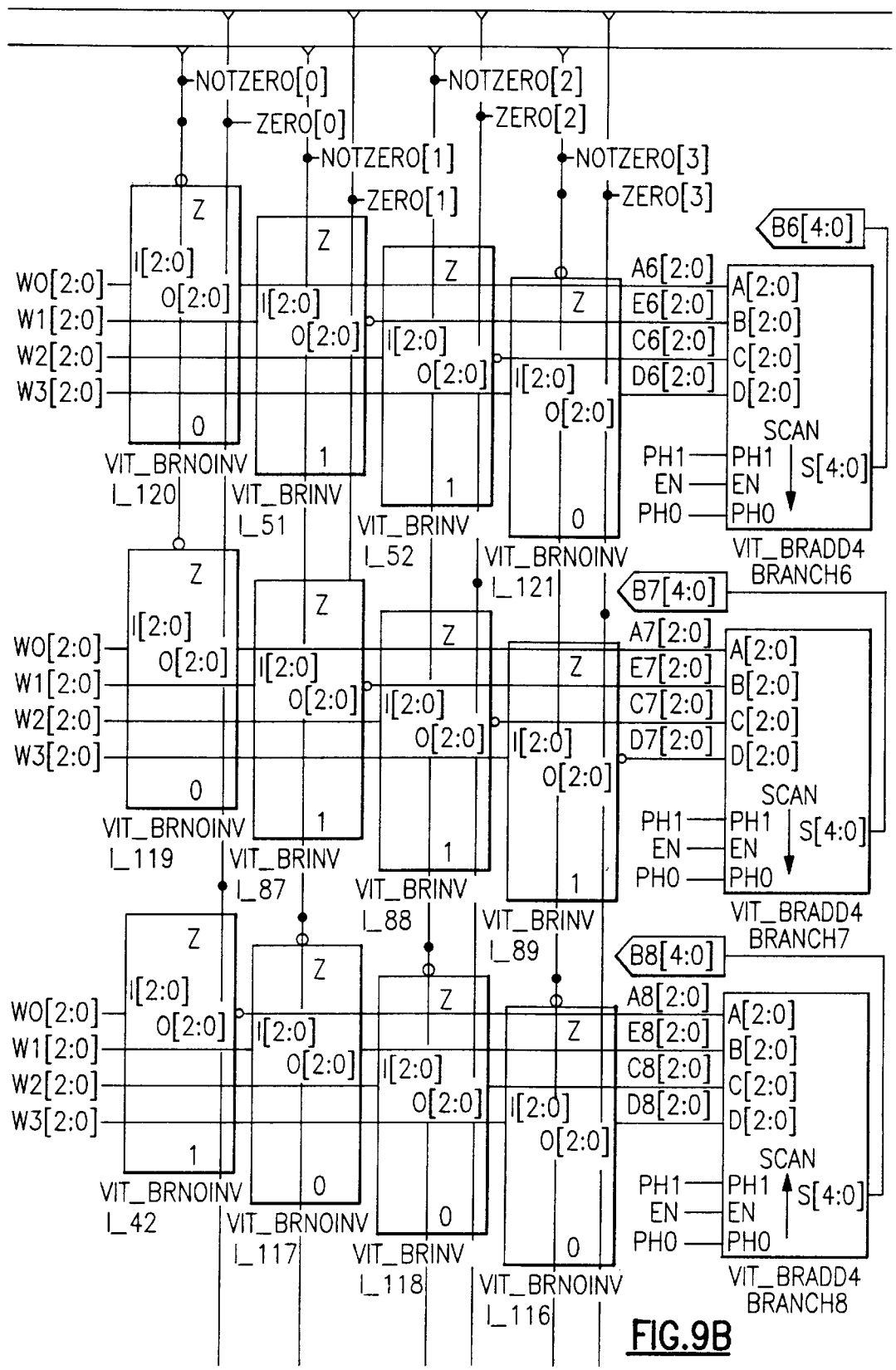
Figure 9C:
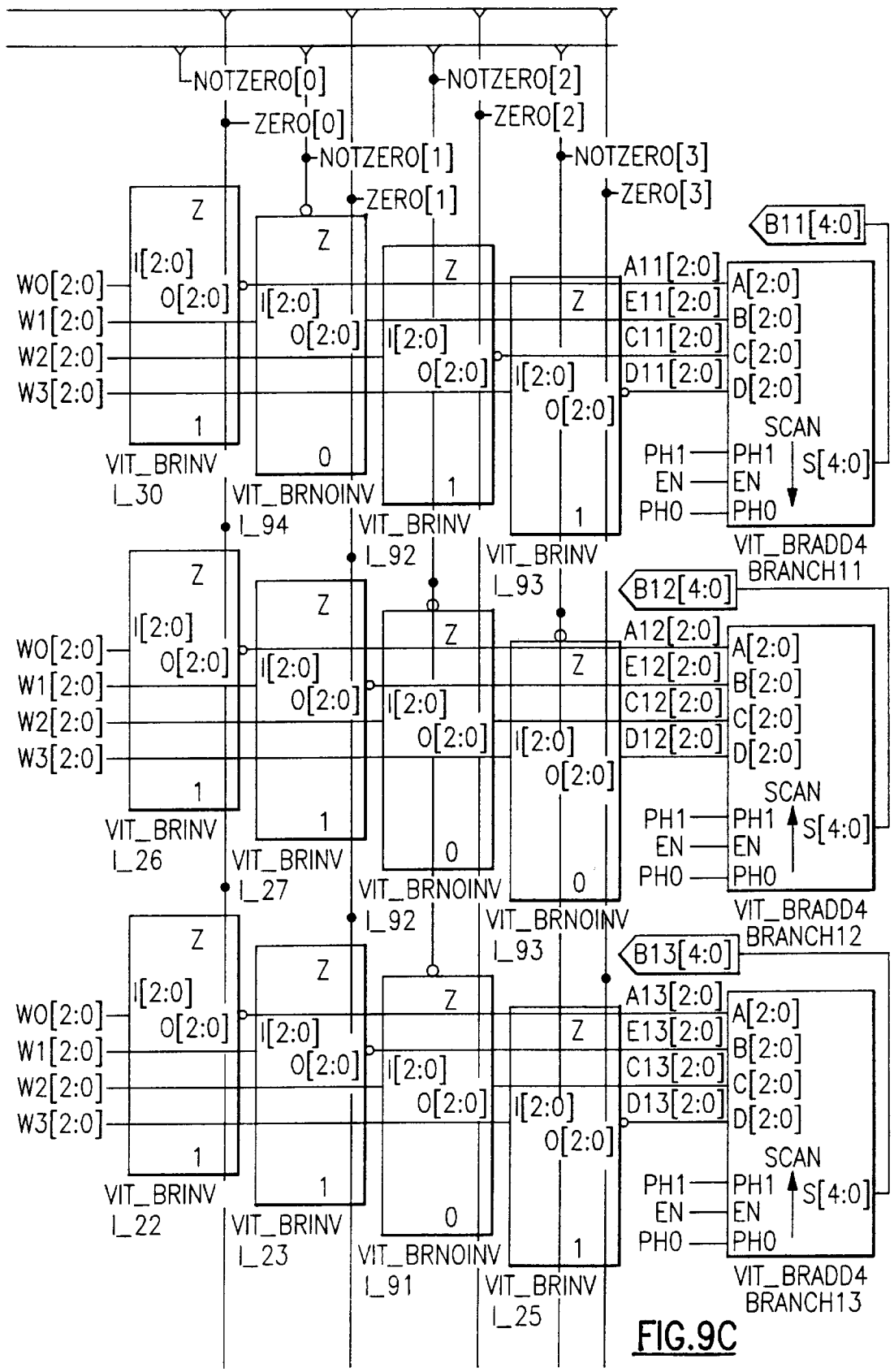
Figure 9E:
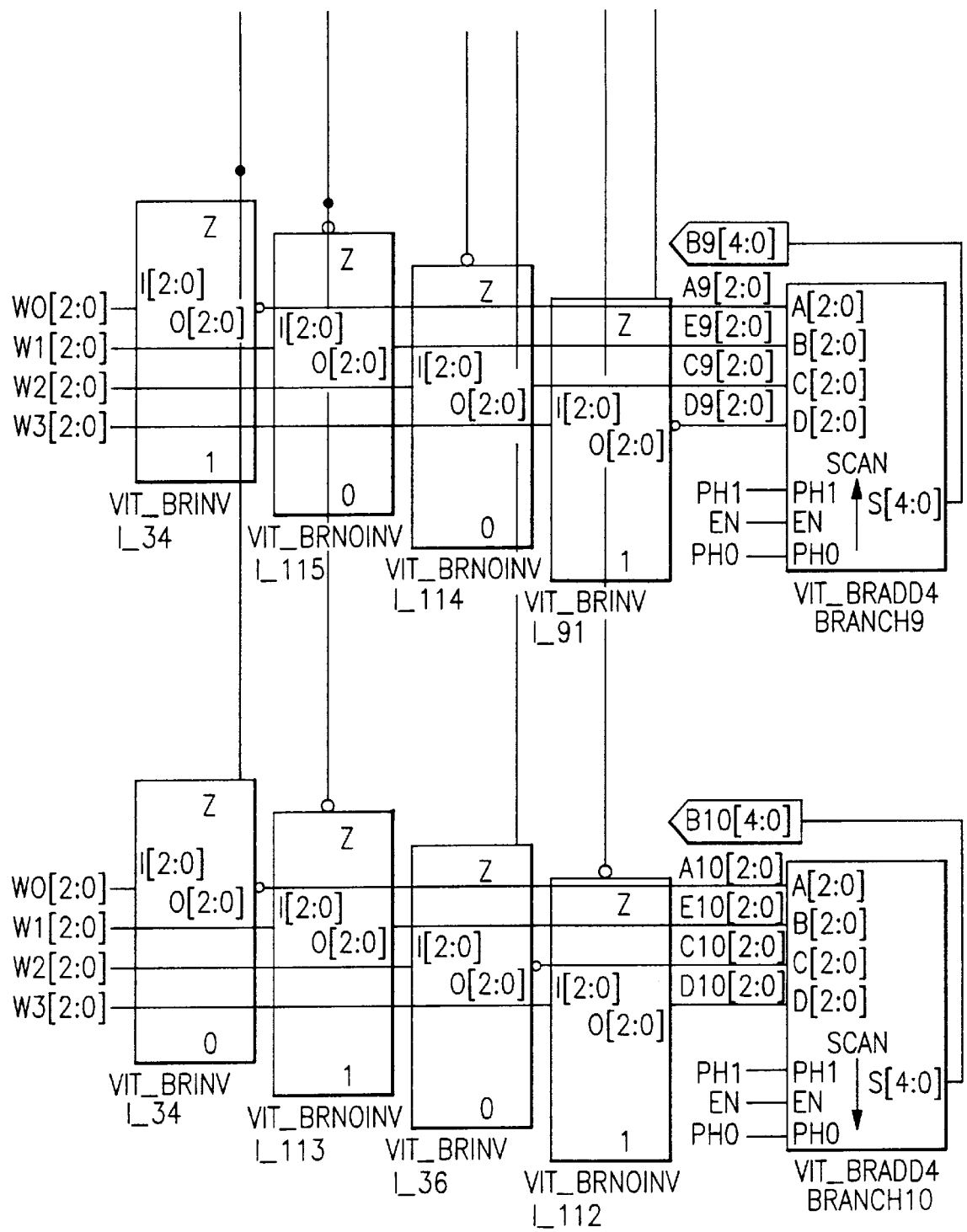
Figure 9F:
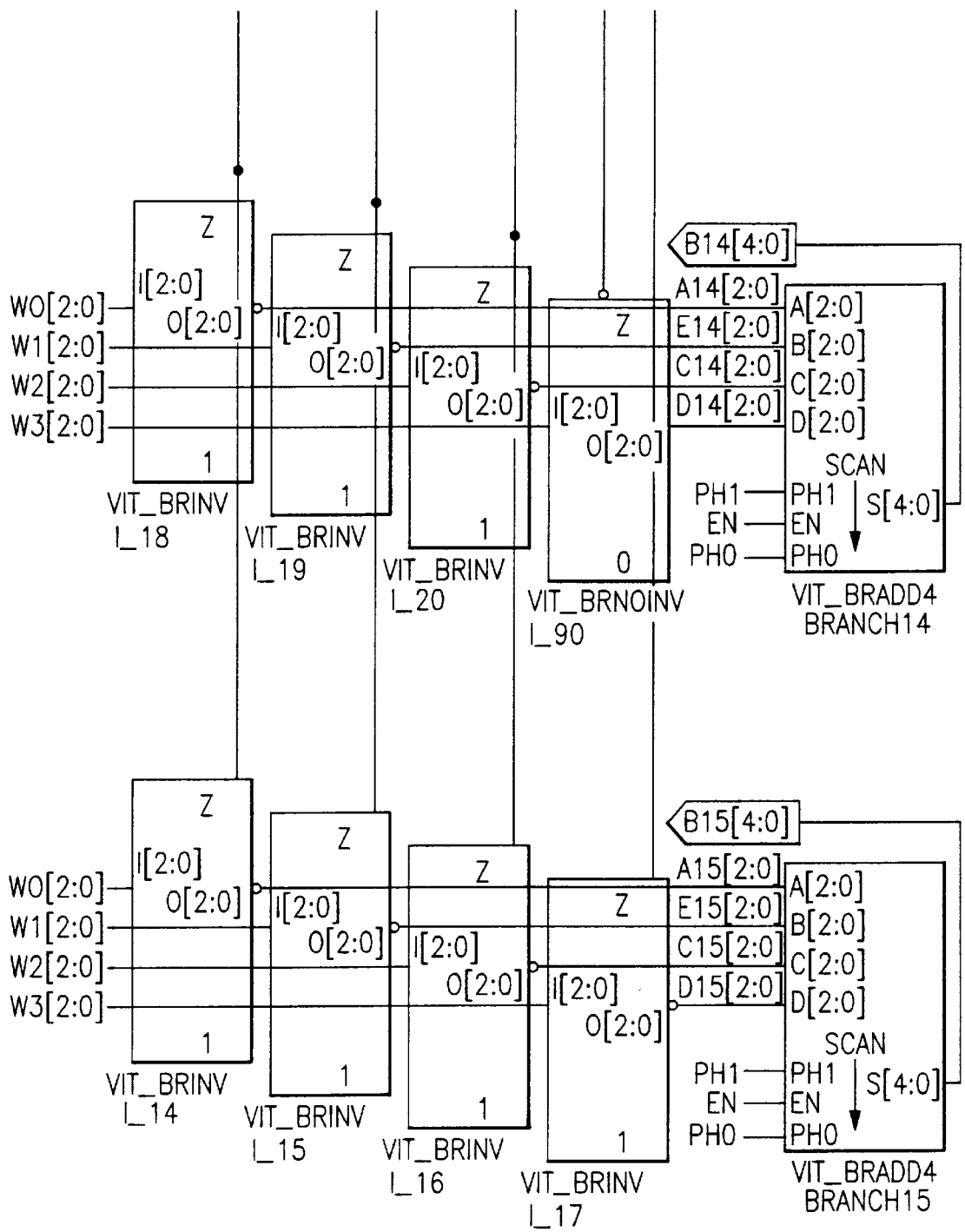
Figure 10:
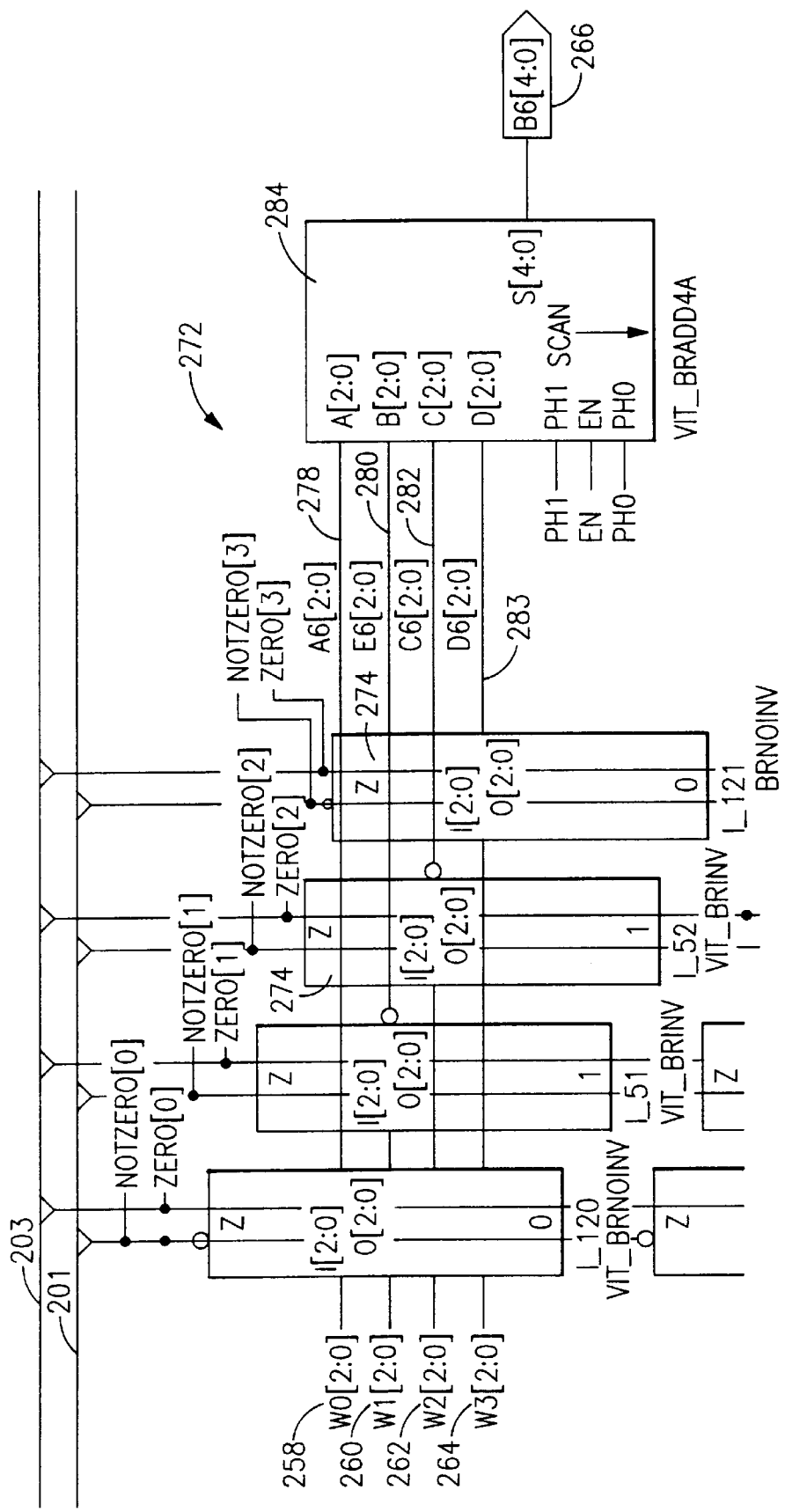
FIG. 10 is a detailed electrical schematic of a calculation unit in the circuit of FIG. 9.
Figure 11:
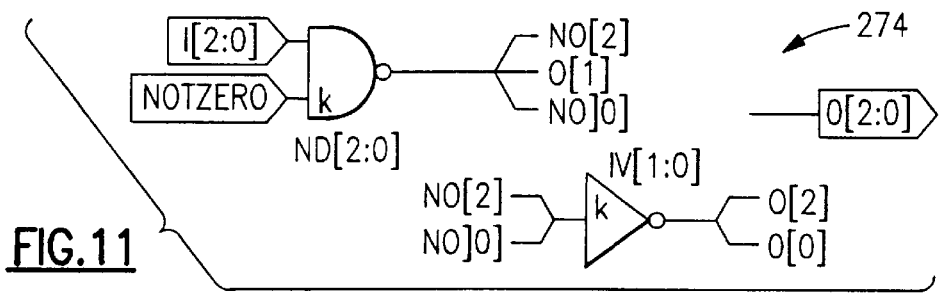
FIG. 11 is an electrical schematic of a logical network which is employed in the circuit illustrated in FIG. 10.
Figure 12:
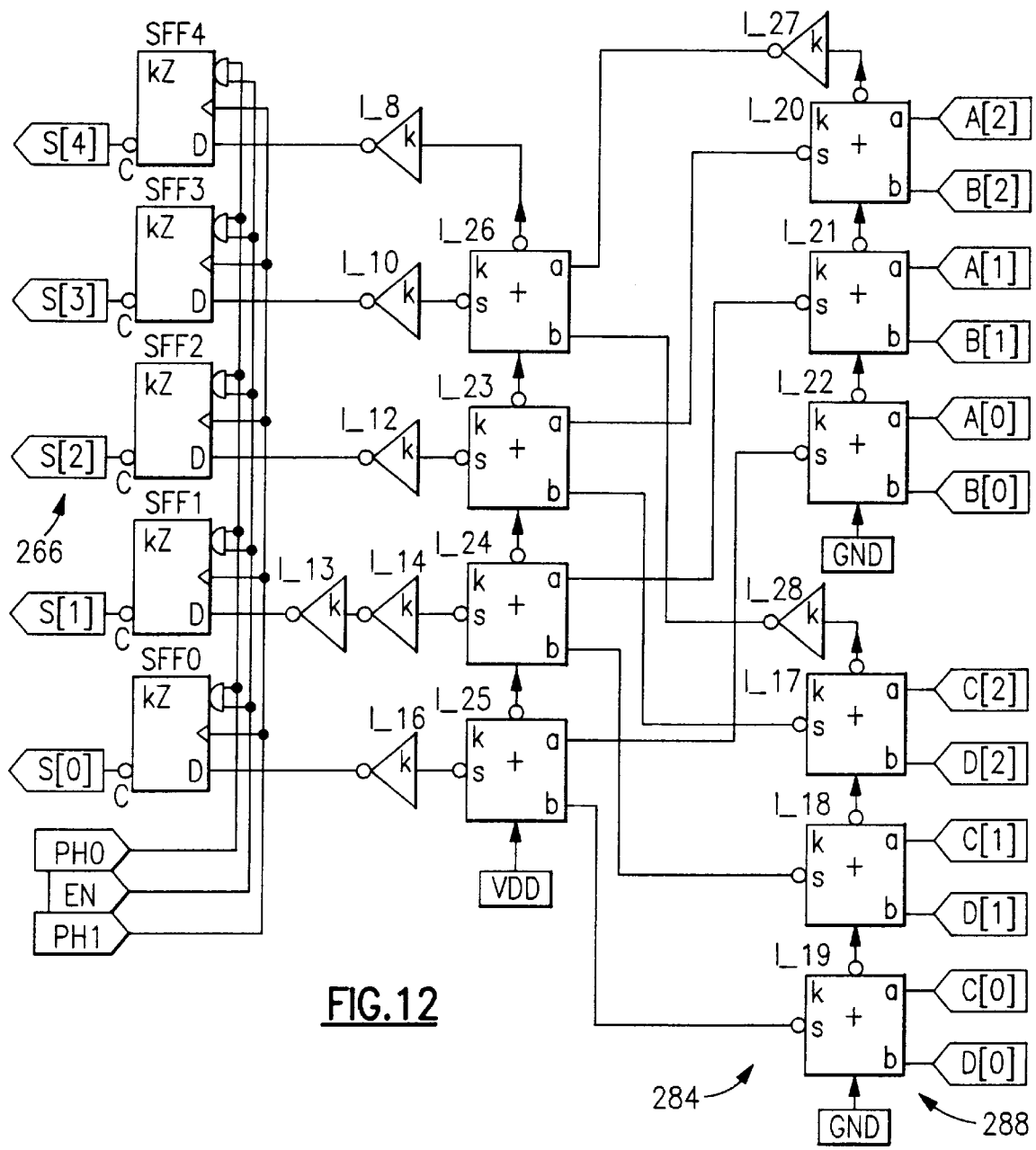
FIG. 12 is an electrical schematic of a summing unit of the circuit of FIG. 9.

Block 256 is illustrated in greater detail in FIG. 9, and comprises 16 identical calculation units 272, one for each of the 16 possible branches. A representative calculation unit 272 is described in yet further detail in FIG. 10. Each calculation unit 272 includes four modules 274 in which the expected data is hard-wired. The modules 274 sum the absolute differences between the input data and the expected data for that particular branch, in the manner shown in Table 3, and force the data corresponding to punctuated positions to zero in accordance with the states of lines 201 and 203. As shown in FIG. 11 the modules 274 comprise a simple logical network, which determines absolute differences, by inverting alternate bits. The four differences thus obtained on lines 278, 280, 282, 283 are summed in summing unit 284, which is illustrated in detail in FIG. 12 for output on lines 266 as the branch metric.

Figure 13A:
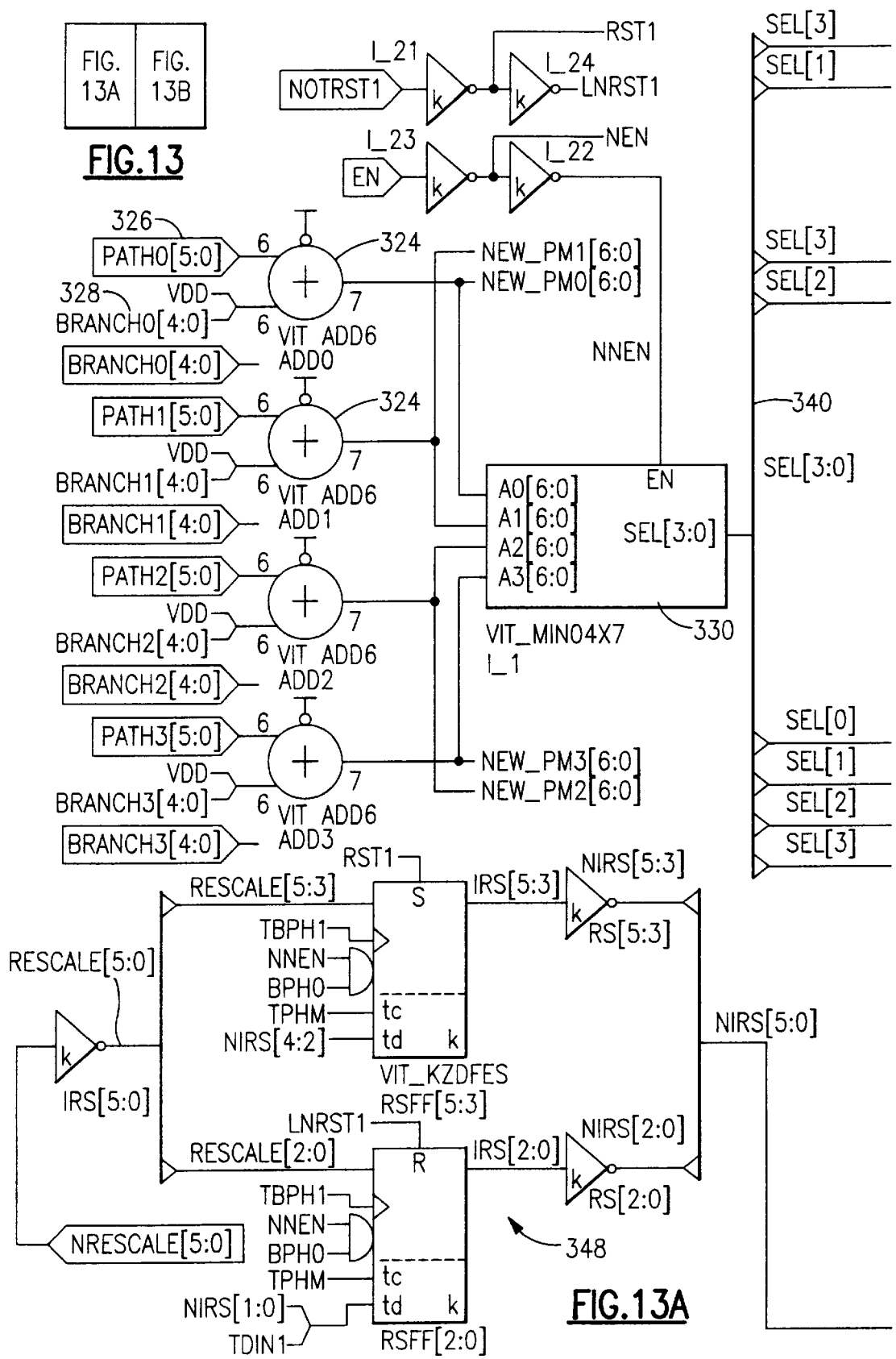
FIGS. 13A–13B, collectively referenced
Figure 13B:
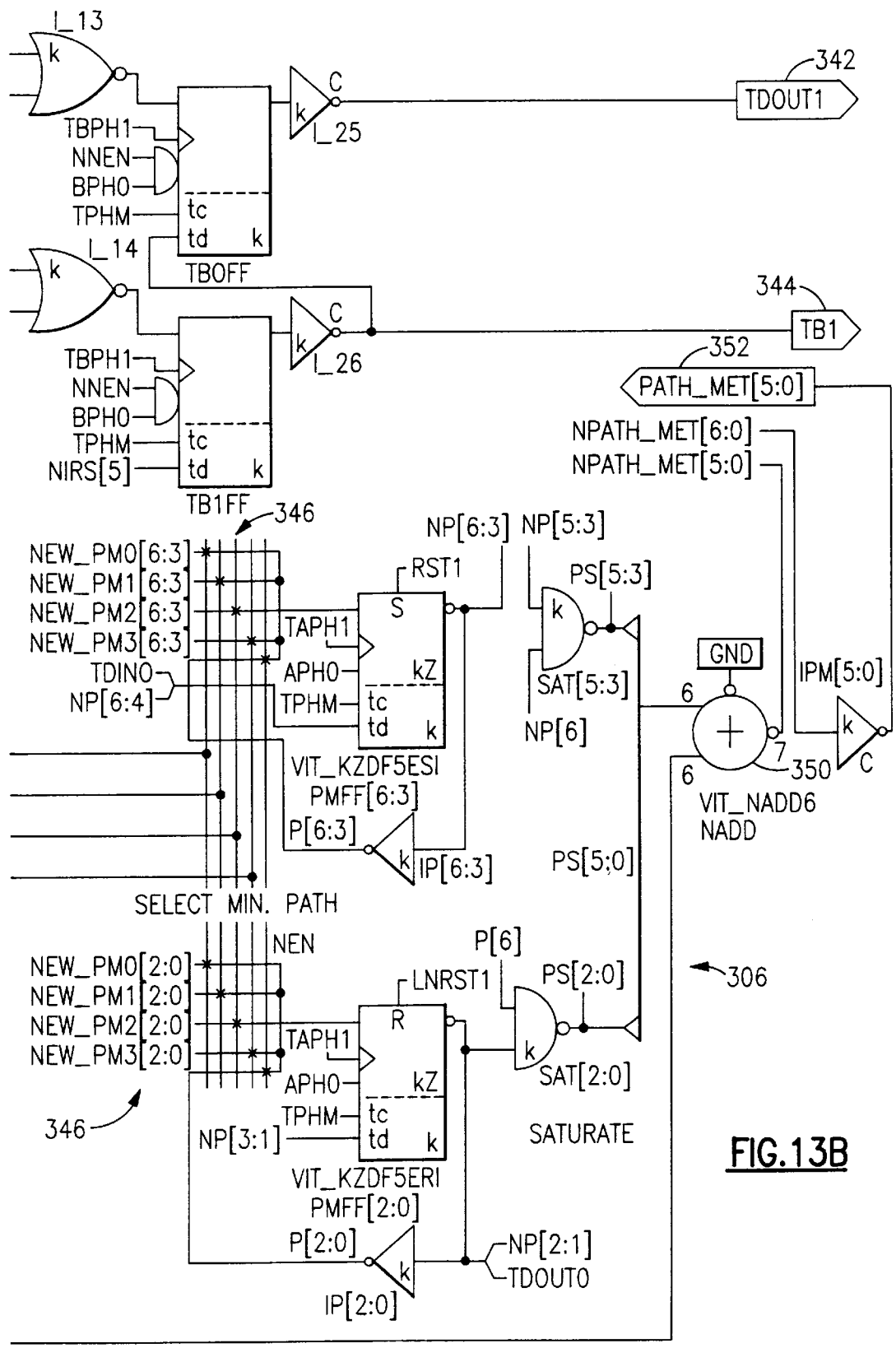

Turning now to FIGS. 3 and 13, path metrics are calculated in path metric generation block 189, utilizing the precalculated branch metrics obtained from the branch metric generation block 186 on lines 288. Precalculation of the branch metrics greatly simplifies the calculation of the path metrics. The path metric generation block 189 is able to process 2 symbols in one clock cycle. By appropriate hardware design choices, the branch metric generation block 186 and the path metric generation block 189 can optionally be generalized to process m symbols in a single clock cycle using an m-stage Viterbi decoder.

Figure 14:
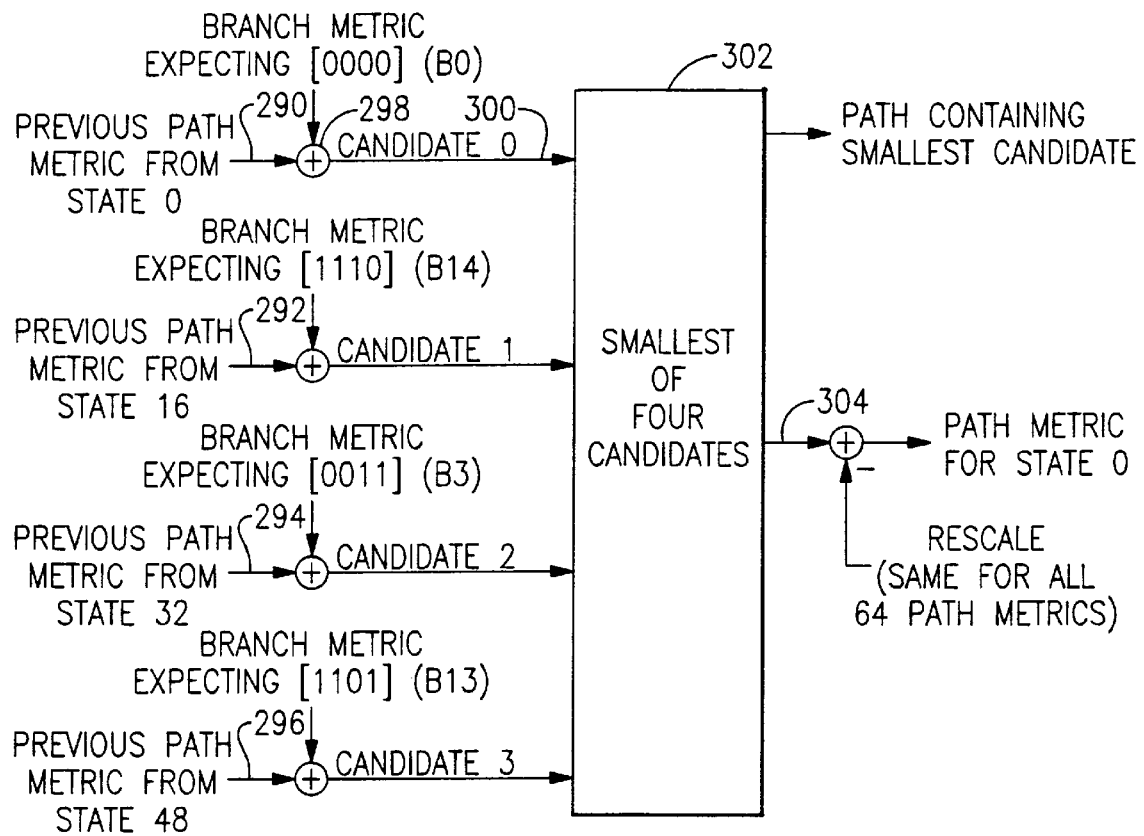
FIG. 14 is diagram illustrating the calculation of a path metric.

The organization of the path metric generation block 189 is initially shown, by way of example, in FIG. 14, where the calculation of a path metric for state 0 is shown. A full expansion of the trellis diagram illustrated in FIG. 2 would show that at $S_{t+1}$, state 0 can legally receive transitions from states 0, 16, 32, and 48, referenced as 290, 292, 294 and 296 respectively. These transitions are referred to in Table 4 as paths 0–3 respectively, corresponding to the two most significant bits of their state number. Table 4 discloses the branch metrics for each legal transition in the transitional trellis diagram of FIG. 2. From Table 4 it can be seen that for state 0, path 0 has expected branch data of 0; path 1 expects 14; path 2 expects 3; and path 3 expects 13. Using the received data, the branch metrics for each expected branch data are calculated. To calculate the four possible candidates for state 0's next path metric, the previous path metric for state 0 is added to the branch metric with expected data 0, using adder 298 to give candidate 0 on line 300, and so on for the other three paths. Then, after comparison of the four candidates in block 302, the next path metric for state 0 is the smallest candidate value, and is output on line 304. The other candidates are discarded, as they are non-optimum paths.

Two data bits passed onto the traceback indicate which path was chosen as having the smallest path metric, i.e. path 0, 1, 2 or 3, as required to trace back in time.

TABLE 4

State 0: path 0 = 0 1 = 14 2 = 3 3 = 13   State 32: path 0 = 8 1 = 6 2 = 11 3 = 5
State 1: path 0 = 12 1 = 2 2 = 15 3 = 1   State 33: path 0 = 4 1 = 10 2 = 7 3 = 9
State 2: path 0 = 7 1 = 9 2 = 4 3 = 10    State 34: path 0 = 15 1 = 1 2 = 12 3 = 2
State 3: path 0 = 11 1 = 5 2 = 8 3 = 6    State 35: path 0 = 3 1 = 13 2 = 0 3 = 14
State 4: path 0 = 13 1 = 3 2 = 14 3 = 0   State 36: path 0 = 5 1 = 11 2 = 6 3 = 8
State 5: path 0 = 1 1 = 15 2 = 2 3 = 12   State 37: path 0 = 9 1 = 7 2 = 10 3 = 4

TABLE 4-continued

| | |
|---|---|
| State 6: path 0 = 10 1 = 4 2 = 9 3 = 7 | State 38: path 0 = 2 1 = 12 2 = 1 3 = 15 |
| State 7: path 0 = 6 1 = 8 2 = 5 3 = 11 | State 39: path 0 = 14 1 = 0 2 = 13 3 = 3 |
| State 8: path 0 = 15 1 = 1 2 = 12 3 = 2 | State 40: path 0 = 7 1 = 9 2 = 4 3 = 10 |
| State 9: path 0 = 3 1 = 13 2 = 0 3 = 14 | State 41: path 0 = 11 1 = 5 2 = 8 3 = 6 |
| State 10: path 0 = 8 1 = 6 2 = 11 3 = 5 | State 42: path 0 = 0 1 = 14 2 = 3 3 = 13 |
| State 11: path 0 = 4 1 = 10 2 = 7 3 = 9 | State 43: path 0 = 12 1 = 2 2 = 15 3 = 1 |
| State 12: path 0 = 2 1 = 12 2 = 1 3 = 15 | State 44: path 0 = 10 1 = 4 2 = 9 3 = 7 |
| State 13: path 0 = 14 1 = 0 2 = 13 3 = 3 | State 45: path 0 = 6 1 = 8 2 = 5 3 = 11 |
| State 14: path 0 = 5 1 = 11 2 = 6 3 = 8 | State 46: path 0 = 13 1 = 3 2 = 14 3 = 0 |
| State 15: path 0 = 9 1 = 7 2 = 10 3 = 4 | State 47: path 0 = 1 1 = 15 2 = 2 3 = 12 |
| State 16: path 0 = 3 1 = 13 2 = 0 3 = 14 | State 48: path 0 = 11 1 = 5 2 = 8 3 = 6 |
| State 17: path 0 = 15 1 = 1 2 = 12 3 = 2 | State 49: path 0 = 7 1 = 9 2 = 4 3 = 10 |
| State 18: path 0 = 4 1 = 10 2 = 7 3 = 9 | State 50: path 0 = 12 1 = 2 2 = 15 3 = 1 |
| State 19: path 0 = 8 1 = 6 2 = 11 3 = 5 | State 51: path 0 = 0 1 = 14 2 = 3 3 = 13 |
| State 20: path 0 = 14 1 = 0 2 = 13 3 = 3 | State 52: path 0 = 6 1 = 8 2 = 5 3 = 11 |
| State 21: path 0 = 2 1 = 12 2 = 1 3 = 15 | State 53: path 0 = 10 1 = 4 2 = 9 3 = 7 |
| State 22: path 0 = 9 1 = 7 2 = 10 3 = 4 | State 54: path 0 = 1 1 = 15 2 = 2 3 = 12 |
| State 23: path 0 = 5 1 = 11 2 = 6 3 = 8 | State 55: path 0 = 13 1 = 3 2 = 14 3 = 0 |
| State 24: path 0 = 12 1 = 2 2 = 15 3 = 1 | State 56: path 0 = 4 1 = 10 2 = 7 3 = 9 |
| State 25: path 0 = 0 1 = 14 2 = 3 3 = 13 | State 57: path 0 = 8 1 = 6 2 = 11 3 = 5 |
| State 26: path 0 = 11 1 = 5 2 = 8 3 = 6 | State 58: path 0 = 3 1 = 13 2 = 0 3 = 14 |
| State 27: path 0 = 7 1 = 9 2 = 4 3 = 10 | State 59: path 0 = 15 1 = 1 2 = 12 3 = 2 |
| State 28: path 0 = 1 1 = 15 2 = 2 3 = 12 | State 60: path 0 = 9 1 = 7 2 = 10 3 = 4 |
| State 29: path 0 = 13 1 = 3 2 = 14 3 = 0 | State 61: path 0 = 5 1 = 11 2 = 6 3 = 8 |
| State 30: path 0 = 6 1 = 8 2 = 5 3 = 11 | State 62: path 0 = 14 1 = 0 2 = 13 3 = 3 |
| State 31: path 0 = 10 1 = 4 2 = 9 3 = 7 | State 63: path 0 = 2 1 = 12 2 = 1 3 = 15 |

Figure 2:
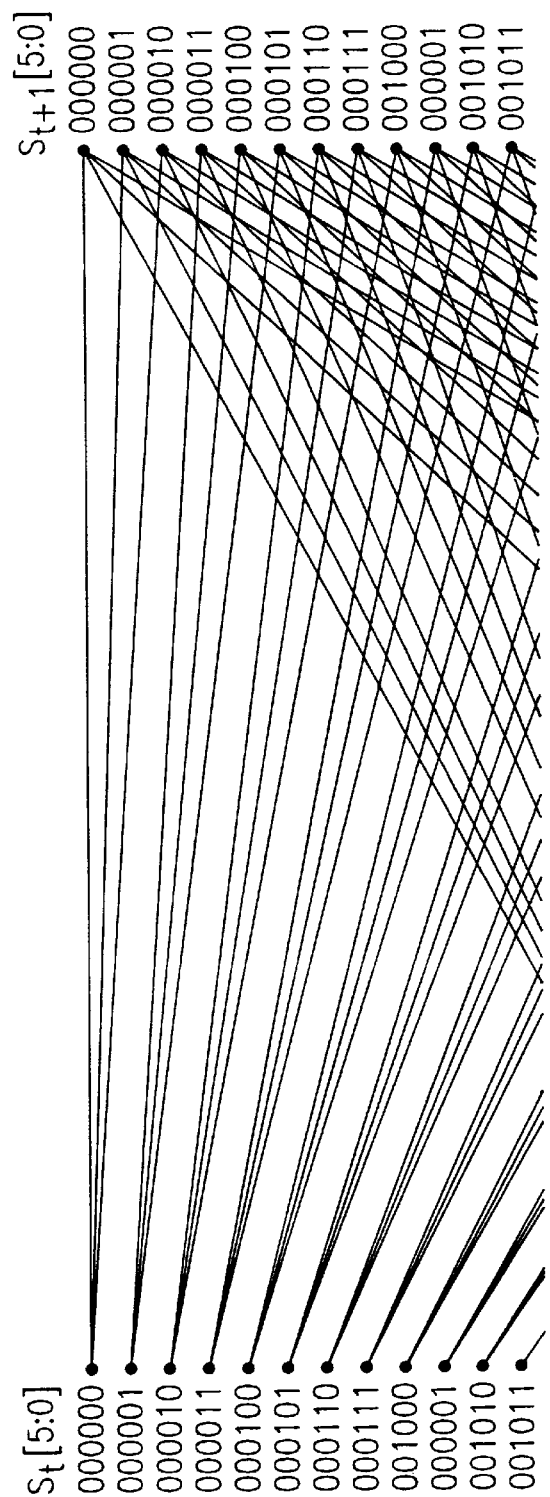
FIG. 2 is a fragmentary view of a transition trellis diagram according to the Viterbi coding process performed in the preferred embodiment of the invention.
Figure 3A:
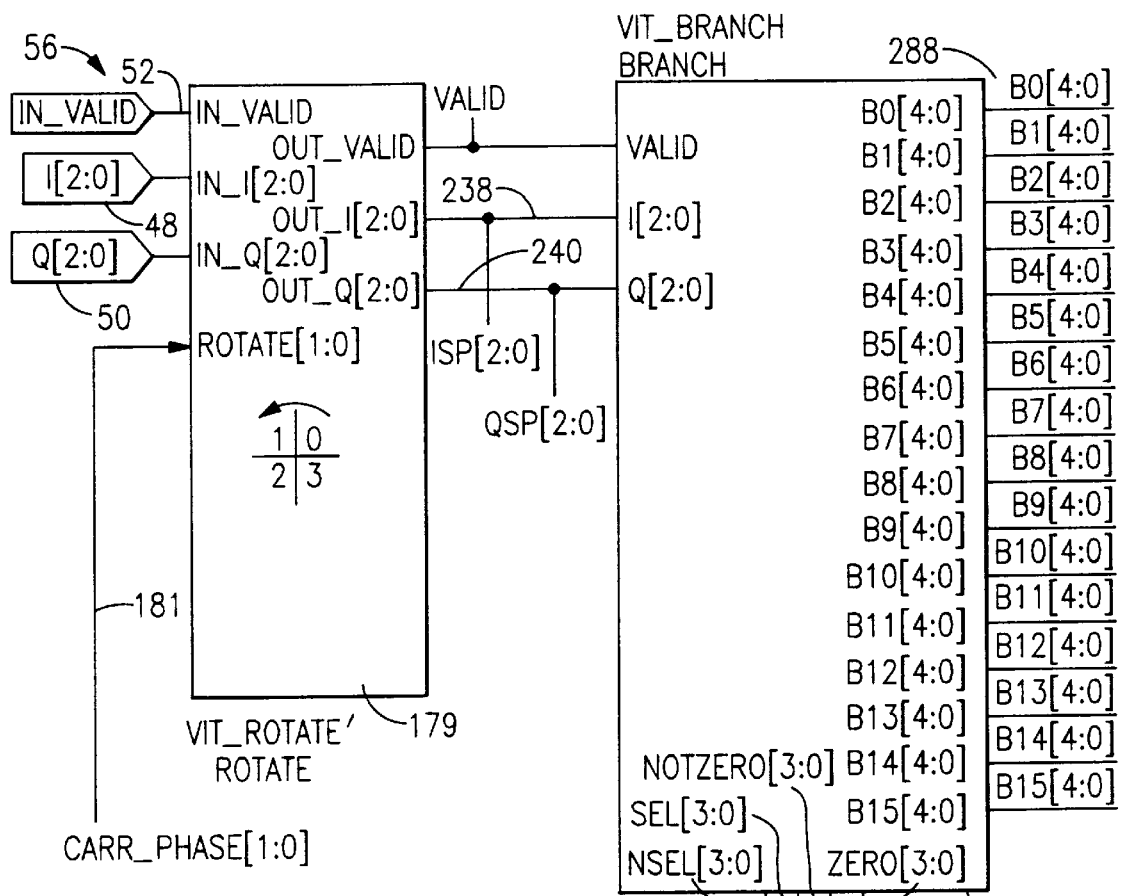
FIGS. 3A–3B, collectively referenced
Figure 3A:
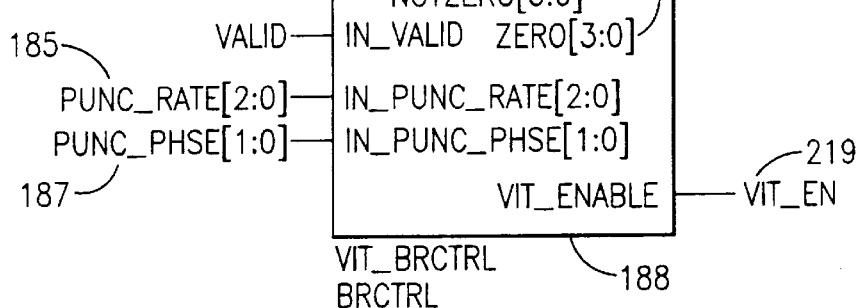
Figure 3B:
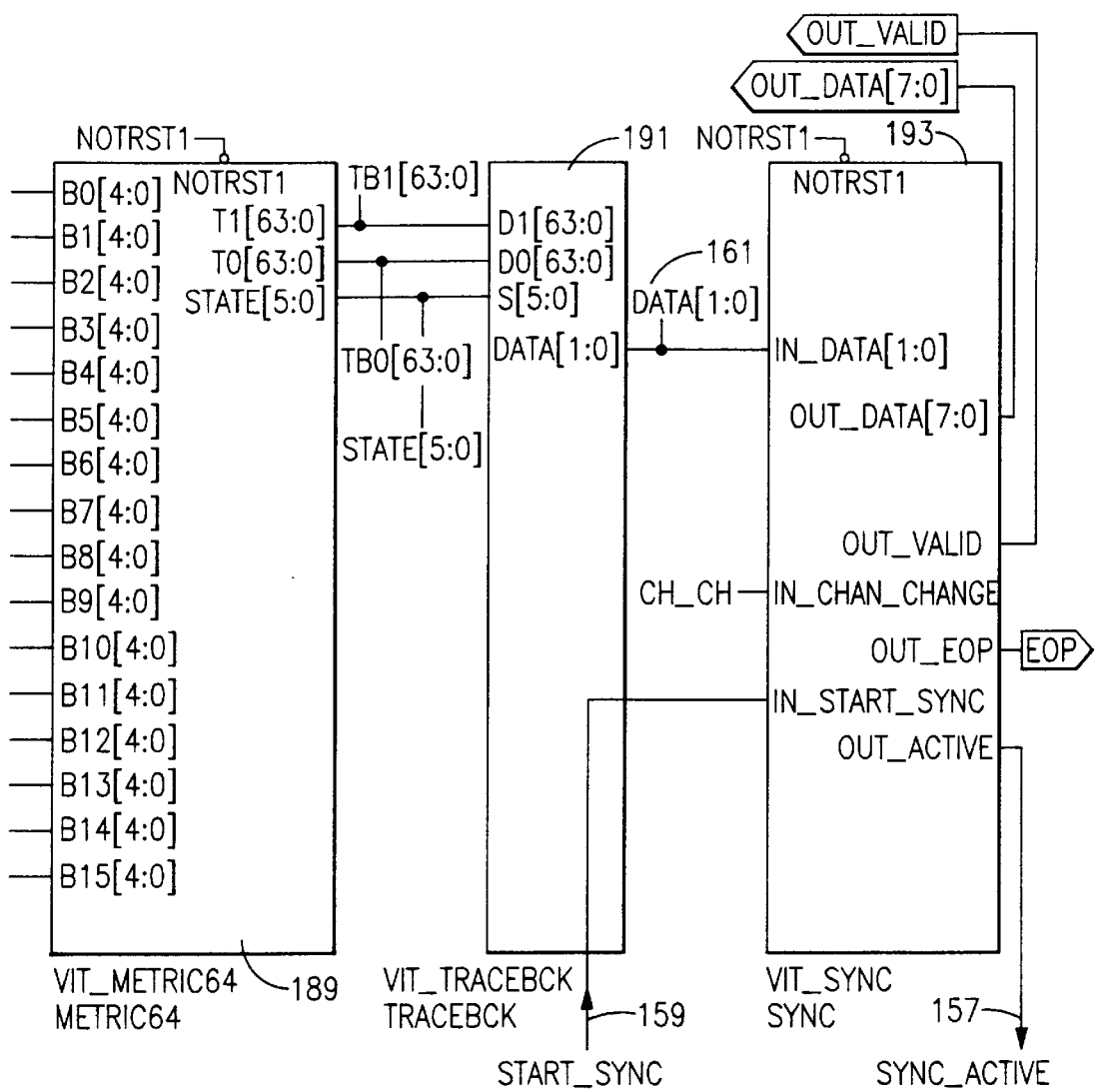
Figure 3B:
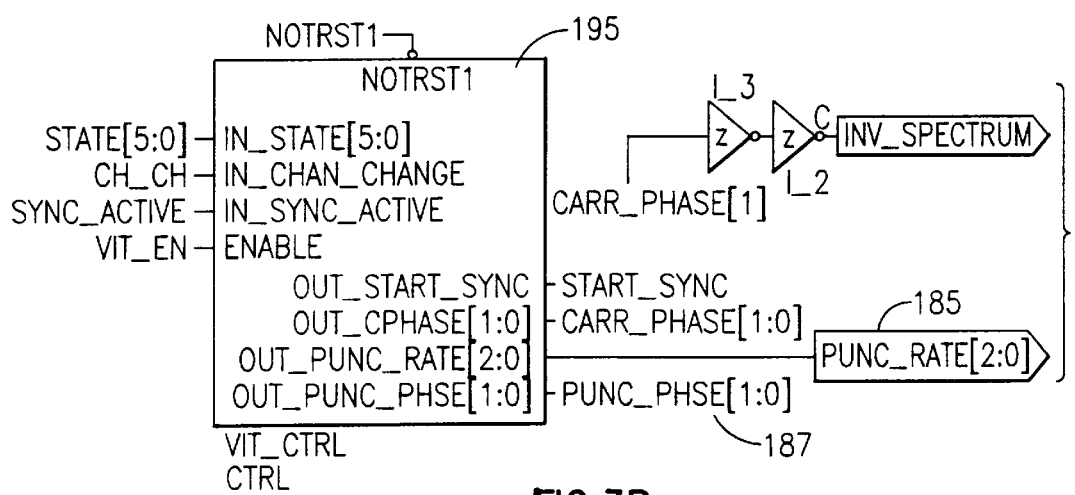
Figure 15:
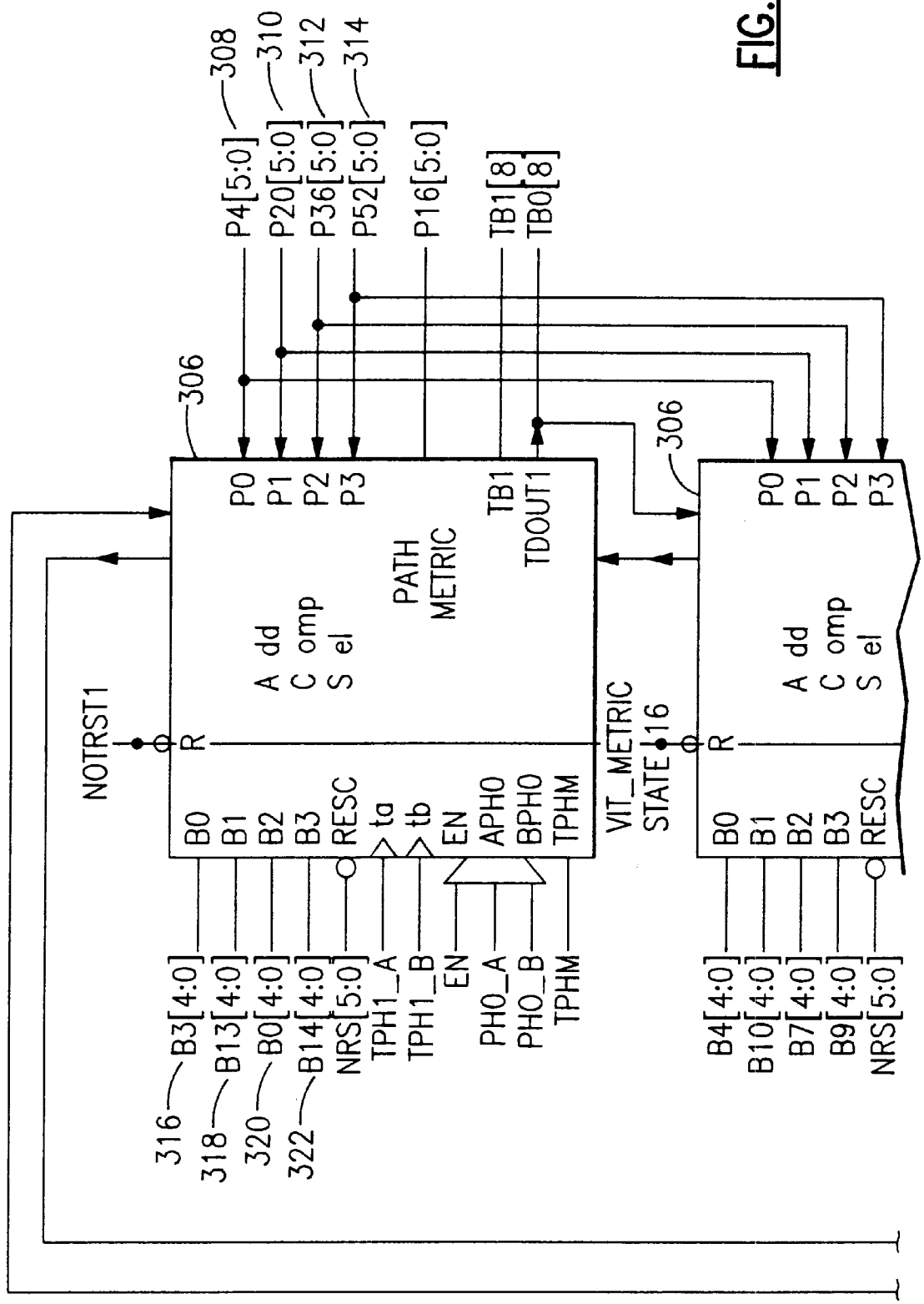
FIG. 15 is a fragmentary block diagram illustrating an add-compare-select unit in the path metric generation block of the Viterbi decoder illustrated in FIG. 13.

The path metric generation block 189 comprises 64 add-compare-select blocks 306, one of which is fully shown in a fragmentary view in FIG. 15. Each of the add-compare-select blocks 306 generates a path metric. In actual layout, it is convenient to arrange the 64 add-compare-select blocks 306 in two groups of 32. This is a more compact design which minimizes the length and thus the driving requirements of the path metric routing crossbar. The smallest of the 64 path metrics is determined in the path metric generation block 189. Each of the add-compare-select blocks 306 receives four path metrics of a previous state each on 6-bit buses 308, 310, 312, 314, corresponding to transitions such as shown in FIG. 2. The corresponding branch metrics are received on 5-bit buses 316, 318, 320, and 322.

Figure 16:
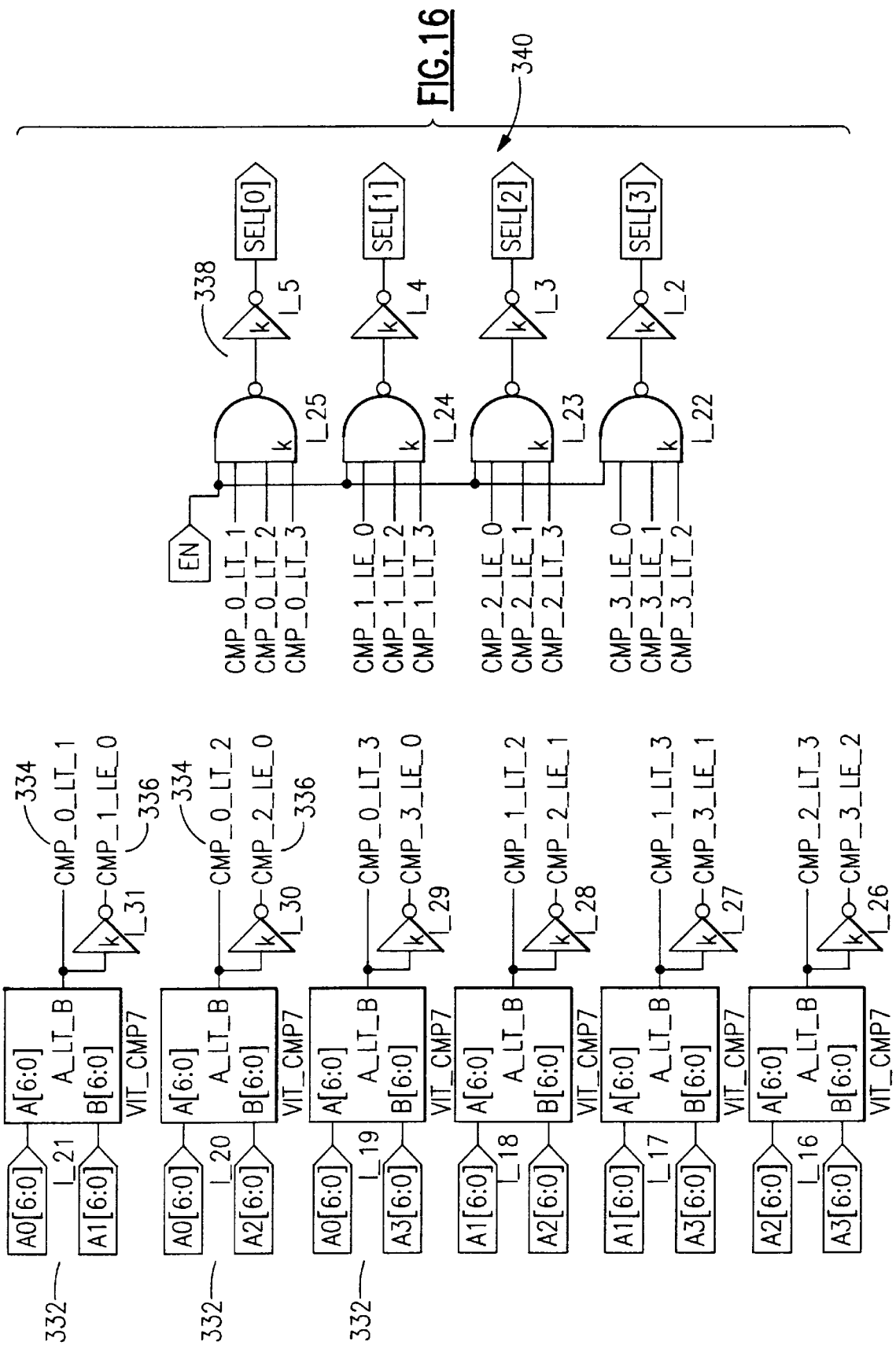
FIG. 16 is an electrical schematic of a portion of an add-compare-select unit in the path metric generation block of the Viterbi decoder illustrated in FIG. cf1.

FIG. 13 illustrates the arrangement of an add-compare-select block 306 in greater detail, wherein a minimum path metric of the 4 candidate path metrics input thereto is determined. The candidate path metrics are obtained in adders 324 by the addition of a path metric and a branch metric which are input on buses 326 and 328 respectively. The minimum path metric is then determined in compare module 330. Compare module 330 is shown in further detail in FIG. 16, in which four values are compared to find the minimum. In the six units 332 at the left side of FIG. 16, all possible comparisons are made and outputted on lines 334, 336. The outputs on lines 336 are simply the inversions of the outputs on lines 334 for each respective unit 332. The results are then decoded in a logical network 338 and placed on a four-bit select bus 340. An advantage of the arrangement is that the add, compare, and rescale operations, discussed below, can be pipelined to save time.

Referring again to FIGS. 3 and 13, two bits of information are provided to a traceback unit 191 on lines 342 and 344 at each data cycle of operation of each add-compare-select block 306. Selection of the smallest path metric is accomplished using multiplexers referenced generally 346. To allow the path metric to be represented by six bits in order to reduce hardware, a rescaling unit 348 rescales the smallest path metric in an adder 350. The smallest path value is rescaled according to the equation $$RV = \frac{xz^{-2}}{1 + z^{-1} + z^{-2}} \quad (2)$$

wherein x is the smallest path metric, RV is the rescale value, and $z^{-1}$ and $z^{-2}$ are x delayed by 1 and 2 cycles of operation of the add-compare-select block 306 respectively. The delay is employed because 2 cycles are required to calculate the smallest path metric. The resealing function utilized guarantees that the rescaled value RV will never be negative. The rescaled path metric is output on bus 352.

Referring now to FIG. 3, the Viterbi decoder has a control block 195, which has several functions. In a first mode of operation, illegal state transitions of the path having the smallest path metric are counted as a measure of whether the currently estimated puncture rate, puncture phase and carrier phase have been correctly determined. Based on the illegal state transition count, a new combination of puncture rate, puncture phase, and carrier phase are chosen. If the illegal state transition count is within a specified tolerance, a second mode of operation is initiated, wherein an output data stream is enabled in which a correct synchronization pattern is sought. However, the end-state of the first mode of operation is retained. Hence if synchronization is not achieved, the first mode of operation is resumed at the end-state. This can be appreciated with reference to FIG. 17. Initially, in step 354, the illegal state counter and a wait counter are reset. At decision step 356 a check is immediately made to determine of a permissible number of illegal states transitions has been exceeded.

A test is next made at step 370 for the occurrence of an illegal state transition. If an illegal state transition has not occurred, control immediately passes to decision step 360. If an illegal state transition has occurred, an illegal transition state counter is incremented at step 372. Otherwise control passes to step 358. Another test of the cumulative number of illegal state transitions is performed in decision step 374. If the number of illegal states is still within tolerance, control passes to step 358. Otherwise step 366 is executed, as will be explained below.

The wait counter is incremented in step 358. Next, at decision step 360 a test is made to determine if the 256 cycles have been evaluated, according to the state of the wait counter. If not, control returns to step 356. If 256 cycles have been evaluated and the illegal state transitions remain within tolerance, synchronization search is activated in step 362. Control then proceeds to decision step 364, wherein activity of the synchronization unit is tested. Until synchronization fails, control remains in step 364.

In the event synchronization fails, control returns to the first mode of operation at decision step 366. Control also shifts to step 366 if, at any execution of step 356, the number of illegal state transitions is not within tolerance. Step 366 is a decision step wherein a test is made for exhaustion of all possible combinations of puncture phases and carrier phases. If these have not been exhausted, the carrier phase is changed in step 368, and control returns to step 354. If the test at decision step 366 fails, then a further test is made at decision step 376 to determine if all puncture rates have been evaluated. If exhaustion has not occurred, then the puncture rate and phase are changed at step 378. If all puncture rates and phases have been evaluated, then tolerance is increased at step 380, and control again returns to step 354.

Figure 17:
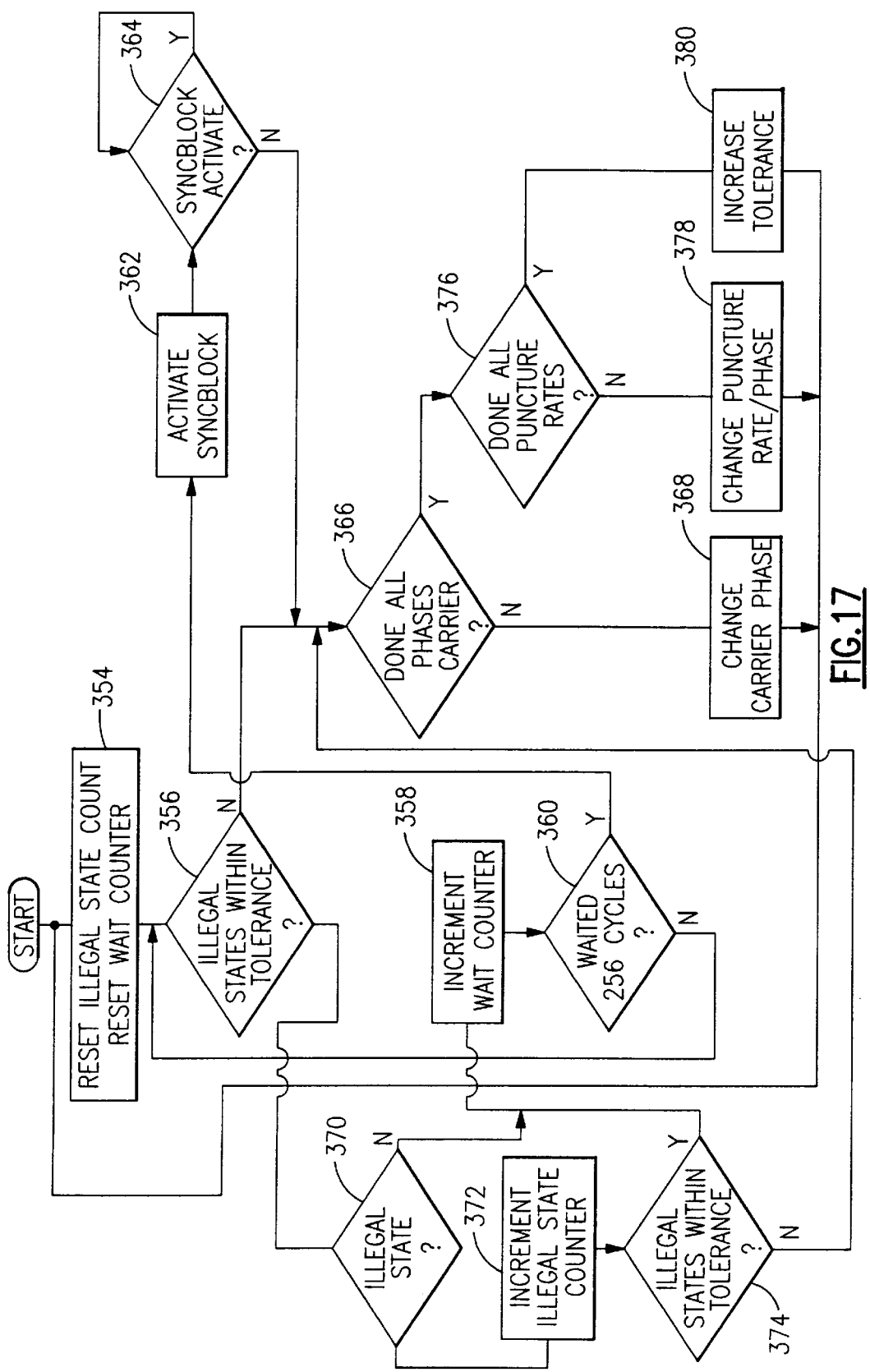
FIG. 17 is a flow diagram illustrating a sequence of operations of the control block of the Viterbi decoder illustrated in FIG. 3.
Figure 18B:
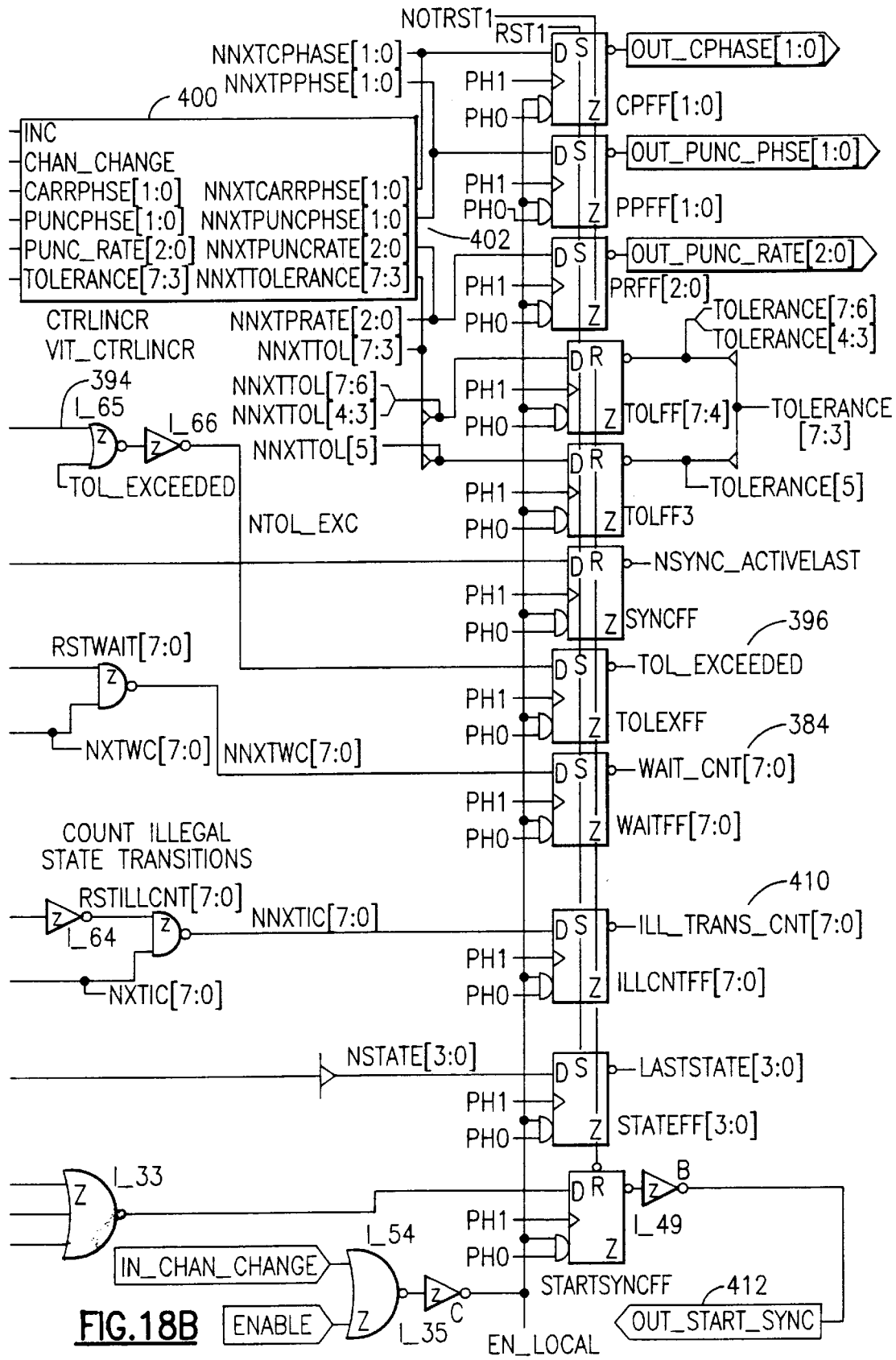

The realization of the flow diagram shown in FIG. 17 is illustrated in FIG. 18. The wait counter is incremented in incrementer 382, and its value placed on a bus 384. The wait counter is tested in combinatorial logic 386. The number of illegal transitions tolerated is signaled on bus 388, and tested against the illegal state count on bus 390 in a comparator unit 392. A pulse is then generated on line 394, outputted on line 396, and fed back via a logical network 398 to a controller unit 400. The controller unit 400 outputs a new carrier phase, puncture rate, puncture phase, and new tolerance limit on lines generally referenced 402, according to the procedure discussed with reference to FIG. 17. Illegal state transitions are signaled on line 404 as decoded by a logical network 406 taking the previous state as input. Transitions on line 404 are counted in incrementer 408, and the new count value placed on a bus 410.

The second mode of operation, looking for sync bytes in the data stream, is initiated on line 412. This line is the output of a combinatorial logic network 414, which is governed by several control signals, namely the state of the tolerance test line 396, the status of the wait counter on line 416, and the current state of the decoder's second mode of operation, which is indicated on line 418.

Figure 19:
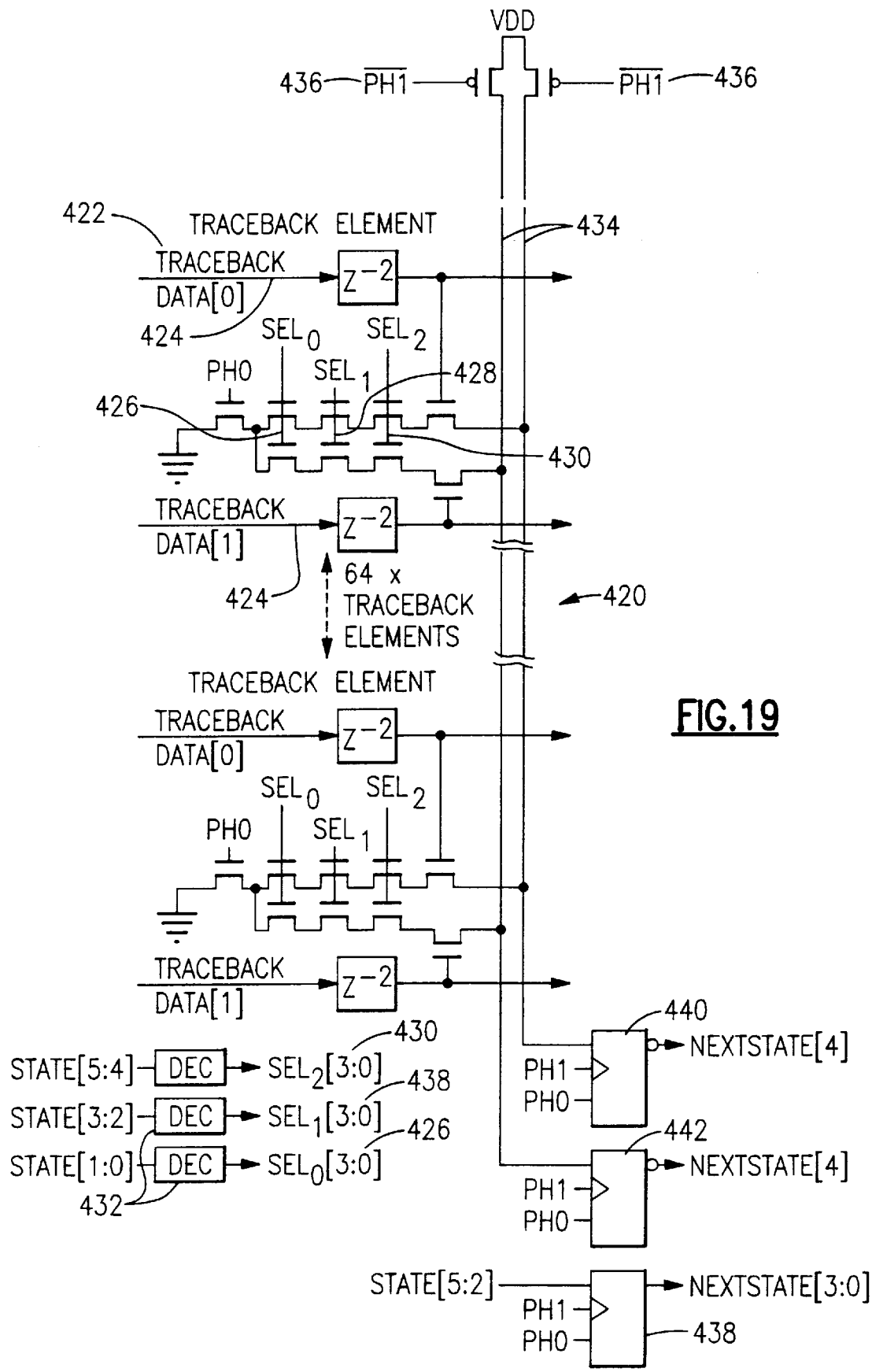
FIG. 19 is an electrical schematic of a traceback column of the traceback unit in the Viterbi decoder illustrated in FIG. 3.

The systolic traceback array unit 191 (FIG. 3) can be further understood with reference to FIG. 19. The traceback array unit 191 is linked to the add-compare-select blocks 306 (FIG. 15) of the path metric generation block 189, and includes a succession of traceback columns 420, each traceback column 420 representing all historical surviving paths determined at a point in time by the add-compare-select blocks 306 and the path metric generation block 189. Each traceback column 420 has a plurality of traceback elements 422, and each traceback element 422 accepts m bits of traceback data 424. As explained herein, m equals 2 in the currently preferred embodiment. The traceback column's traceback elements 424 are addressed by three pre-decoded select lines 426, 428, and 430 according to contents of at least one previous traceback column (not shown), as decoded by three decoders 432. The outputs of each traceback column 420 are placed on precharged lines 434.

In accordance with the known theory of 2-step Viterbi decoding, two bits are acquired in each traceback column 420 to become the two most significant bits of the next traceback column. At each stage in traceback a 6-bit state addresses one of the 64 locations to get the contents of the traceback element and build the next state in the traceback. This 64 to 1 multiplexing is done by precharging the two data lines 434.

As explained above, select lines 426, 428, and 430 are connected according to the state number of the previous traceback element, line 426 tapping the decoded state[1:0] corresponding to its state number, line 428 tapping State [3:2], and line 430 tapping State[5:4]. On clock Ph1 436, the two precharge lines 434 are pulled to VDD. On clock Ph0 438, only one of the traceback elements 424 is selected by select lines 426, 428, and 430, and the precharge lines 434 are pulled down according to the traceback data. The state of the precharge lines 434 is latched in latches 440, 442 to be used for the 2 most significant bits for the next traceback column (not shown). It has been found that the use of precharged lines 434 greatly reduces the area required by the traceback unit 191.

When the last traceback column is reached, two bits of fully decoded I,Q data is outputted on the precharged lines 434 for use by the synchronization block 193 (FIG. 3). The amount of history (size of the window) in the traceback and the number of levels in the quantized I,Q data stream have significant effects on the performance of the Viterbi decoder.

Viterbi Traceback—Further Disclosure

Figure 20:
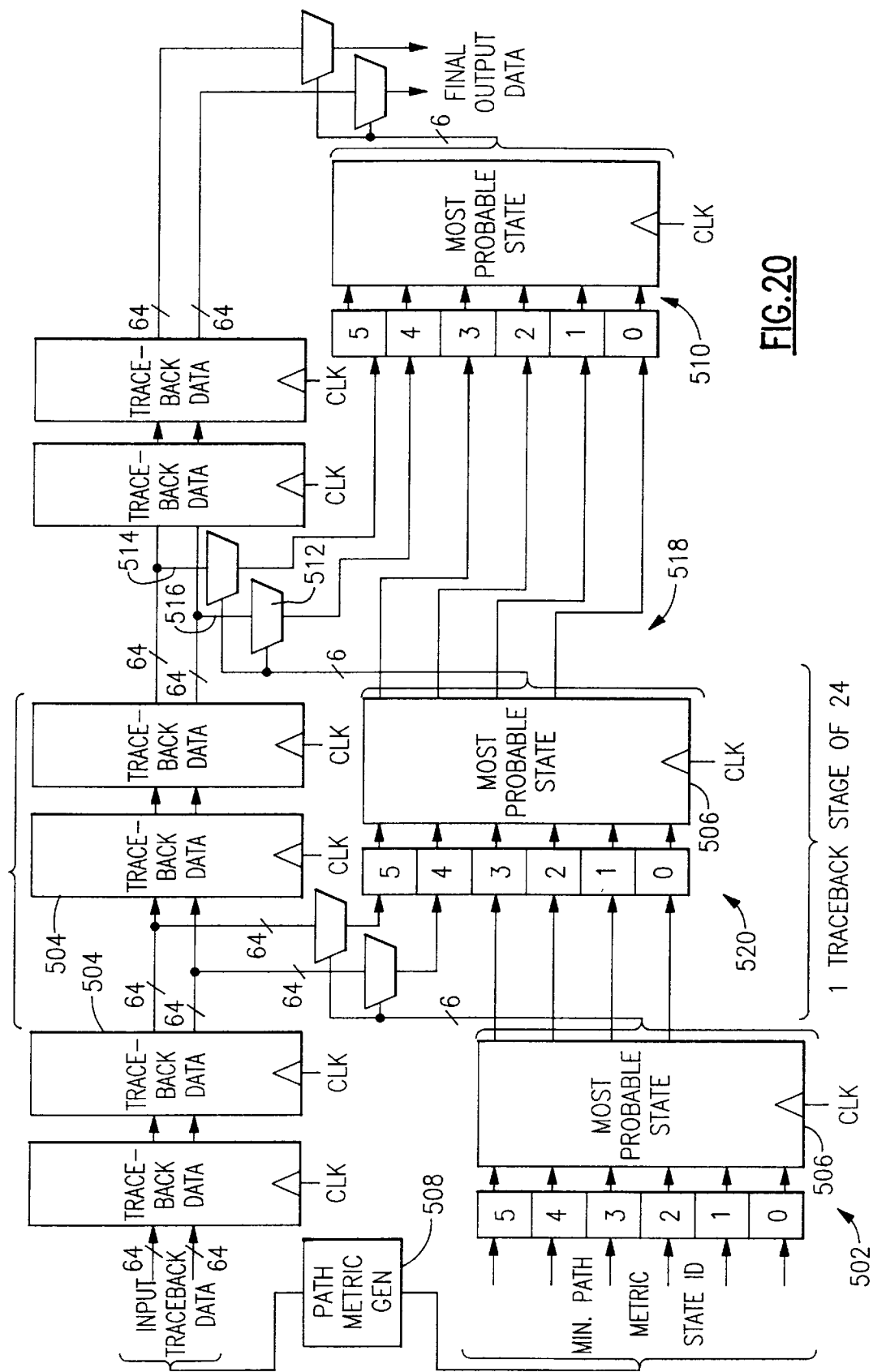
FIG. 20 is an electrical schematic of a traceback unit of a Viterbi decoder.

In the disclosure hereinbelow 24 traceback stages are used to achieve the required error correction performance. However the invention is applicable to other traceback facilities having different number of stages. Each stage operates on 64×2 bits of traceback data, because the current Viterbi decoder design employs 2-step decoding. Referring now to FIG. 20, there is shown in further detail the traceback unit 502 which is employed in the apparatus disclosed above. This operates by indexing the traceback data contained in registers 504 with 6-bit data which are stored in registers 506, and represent the "most probable state". As explained above, the "most probable state" at the input to the traceback unit 502 is that state (of 64 possibilities) which had the minimum path metric value as determined by the path metric generator 508. Duplication of the registers 504 at each stage in the traceback unit 502 is necessary for retiming. The data representing the most probable state in a succeeding stage 510 of traceback is formed with two selectors 512 by using the selected traceback data on lines 514, 516, and the 4 MSBs 518 of the previous most probable state stored in stage 520. The selectors 512 are implemented as 64:1 multiplexers. With this approach, the circuit effectively moves back through the trellis by 2 steps per clock cycle. The approximate resource requirement per traceback stage is shown in Table 4.

TABLE 4

| Resource | Calculation | Total |
| --- | --- | --- |
| Flip-Flops | 64 × 2 × 2 + 6 | 262 |
| Multiplexers (64:1) | 2 | 2 |
| Stage Interconnect | 64 × 2 + 6 | 134 |

In a modern synthesized design, the use of the 64:1 multiplexers unfortunately results in a deep hierarchy of smaller multiplexers which are likely to be too slow or too large in area. Furthermore the requirement for retiming the traceback data results in a large use of flip-flops.

Figure 21:
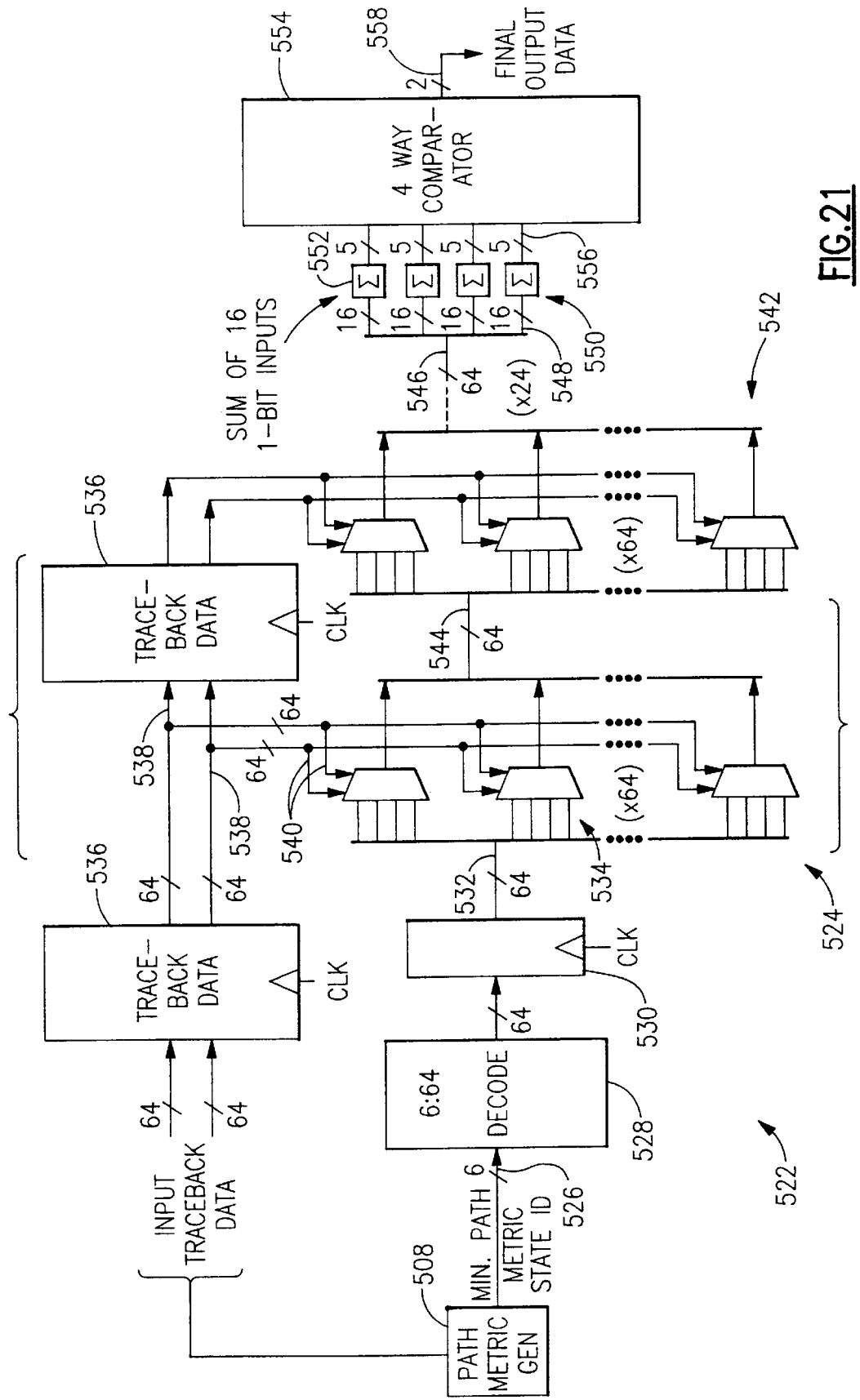
FIG. 21 is an electrical schematic of a traceback unit of a Viterbi decoder in accordance with a preferred embodiment of the invention.

Turning now to FIG. 21 there is shown a traceback unit 522 comprising a plurality of traceback stages, and a particular traceback stage 524. The output of the path metric generator 508 is conducted to the traceback unit 522 on a 6-bit bus 526. The state with the minimum path metric for the current cycle appears on the 6-bit bus 526, which is decoded in a 6:64 decoder 528. After retiming in a register 530, the input to the traceback stage 524 then appears on a 64-bit bus 532. The 64-bit bus 532 is mapped onto a bank 534 of 64 4:1 multiplexers, one multiplexer for each of the 64 states in accordance with the trellis diagram shown in FIG. 2. The trellis diagram is essentially modeled by the architecture of the traceback stage 524, in that each multiplexer in the bank 534 is set by the traceback data to determine its associated state. By definition the state indicated by each multiplexer in the bank 534 represents the most probable step to reach that state from 1 of 4 previous possible states. The input traceback data from previous stages is stored in 64-bit registers 536 and conducted on two 64-bit buses 538. The two bits of traceback data for each of the 64 states in the previous stage are mapped onto the selector lines 540 of the bank 534 of 64 multiplexers. The most probable steps required to reach each state in the current stage is communicated to a succeeding stage 542 on a 64-bit bus 544. When the minimum path metric appears on the 6-bit bus 526 it will ripple through the trellis that is modeled by the traceback stages 524, 542, and by succeeding traceback stages (not shown). An advantage of this arrangement is that retiming is not essential between all stages.

Because the "most probable state" only has to go through one 4-to-1 multiplexer for each step through the trellis, several stages of traceback can be executed in one clock cycle, which is 33 ns in the presently preferred embodiment. It is therefore only necessary to retime the state and traceback data after several stages, further reducing the number of flip-flops in the design. At the output of the traceback unit 522 the 64 lines comprising the bus 546 are mapped into four groups 548 of 16 lines each according to the following table, wherein the states represented are numbered according to the trellis diagram shown in FIG. 2.

TABLE 5

| Group | States Represented |
|---|---|
| 0 | 0–15 |
| 1 | 16–31 |
| 2 | 32–47 |
| 3 | 48–63 |

The groups 548 are presented to a summing unit 550 having 4 adders 552, each of which sums 16 1-bit inputs. The sums are then provided to a 4-way comparator 554 on 5-bit buses 556. The final output on the two-bit bus 558 indicates the smallest of the four inputs to the summing unit 550, corresponding to the 2 most significant bits of the most probable state, i.e. which of the 4 groups of 16 state outputs produced by the adders 552 has the minimum number of outputs set to 1.

For example, where retiming is done after every 6 traceback stages, the average resource utilization per traceback stage in the traceback unit 522 is given in Table 6.

TABLE 6

| Resource | Calculation | Total |
|---|---|---|
| Flip-Flops | 64 × 2 + (64 × 2 + 64)/6 | 160 |
| Multiplexers (4:1) | 64 | 64 |
| Stage Interconnect | 64 × 2 + 64 | 192 |

Although this design results in a much higher number of wire connections, these are conveniently implemented with the use of 3 or 4 layers of metal in an very large scale integrated circuit ("VLSI").

In an alternate embodiment of the invention, the output of the adders 552 can be output on buses that are smaller than the theoretical 5-bit width implied in the design. This is possible in a practical system because the number of state outputs set to 1 should be very small after multiple stages of traceback.

While this invention has been explained with reference to the structure disclosed herein, it is not confined to the details set forth and this application is intended to cover any modifications and changes as may come within the scope of the following claims:

What is claimed is:

1. A M-step Viterbi decoder for a convolutionally encoded data stream of the type having a path metric calculator for K states, and a plurality of traceback stages that in a cycle of operation accept a minimum path metric state identification and traceback data from said path metric calculator, wherein the improvement comprises:
   a plurality of traceback stages, each comprising:
      a first group of K wires having signals thereon representing candidate states of a stage of operation, said first group defining a plurality of input subgroups;
      a bank of K selectors each having N inputs mapped to a said input subgroup, each selector further having selection lines accepting M bits of traceback data; and said bank having K outputs connected to a succeeding traceback stage, wherein $N=2^M$; and
      M groups of K wires for carrying traceback data, wherein a predetermined wire of each group of said M groups is operatively mapped to a said selection line of each said selector; and
   a plurality of retiming registers wherein said plurality of traceback stages exceeds said plurality of retiming registers in number.

2. The Viterbi decoder according to claim 1, wherein said K outputs define a plurality of output subgroups, the decoder further comprising an identification circuit for determining a selected one of said output subgroups that has a maximum number of said candidate states therein.

3. The Viterbi decoder according to claim 2, wherein said identification circuit comprises:
   a plurality of adders each connected to a said output subgroup of said K outputs for adding the outputs thereof;
   a comparator circuit coupled to said adders for identifying an output subgroup associated therewith.

4. A M-step Viterbi decoder for a convolutionally encoded data stream of the type having a path metric calculator for K states, and a plurality of traceback stages that in a cycle of operation accept a minimum path metric state identification and M bits of traceback data from said path metric calculator, wherein the improvement comprises:
   a plurality of traceback stages, each comprising:
      a first group of K wires having signals thereon representing candidate states of a stage of operation, said first group defining a plurality of input subgroups, each said input subgroups having N members, wherein $N=2^M$;
      a bank of K multiplexers each having N inputs mapped to a said input subgroup, each multiplexer further having M selection lines, and an output connected to a succeeding traceback stage; wherein in a last one of said traceback stages said outputs of said bank of K multiplexers define a plurality of output subgroups, each said output subgroup having K/N members;
      M groups of K wires for carrying traceback data, wherein a predetermined wire of each group of said M groups is operatively mapped to a said selection line of each said multiplexer;
      a plurality of adders each connected to a said output subgroup for adding the outputs thereof;
      a comparator circuit coupled to said adders for identifying an output subgroup associated therewith; and
   a plurality of retiming registers for said M groups of K wires, wherein said plurality of traceback stages exceeds said plurality of retiming registers in number.

* * * * *